United States Patent
Shite et al.

(10) Patent No.: US 10,121,685 B2
(45) Date of Patent: Nov. 6, 2018

(54) TREATMENT SOLUTION SUPPLY METHOD, NON-TRANSITORY COMPUTER-READABLE STORAGE MEDIUM, AND TREATMENT SOLUTION SUPPLY APPARATUS

(71) Applicant: Tokyo Electron Limited, Tokyo (JP)

(72) Inventors: Hideo Shite, Koshi (JP); Kazuhiko Kimura, Koshi (JP); Tomoyuki Yumoto, Koshi (JP)

(73) Assignee: Tokyo Electron Limited, Tokyo (JP)

(*) Notice: Subject to any disclaimer, the term of this patent is extended or adjusted under 35 U.S.C. 154(b) by 92 days.

(21) Appl. No.: 15/078,017

(22) Filed: Mar. 23, 2016

(65) Prior Publication Data

US 2016/0288032 A1   Oct. 6, 2016

(30) Foreign Application Priority Data

Mar. 31, 2015 (JP) ................................. 2015-071960
Jan. 25, 2016 (JP) ................................. 2016-011836

(51) Int. Cl.
  *H01L 21/00* (2006.01)
  *H01L 21/67* (2006.01)
(52) U.S. Cl.
  CPC .... *H01L 21/6715* (2013.01); *H01L 21/67017* (2013.01)
(58) Field of Classification Search
  CPC ........... H01L 21/67017; H01L 21/6715; H01L 21/67051; B01D 19/0031; B01D 36/001

(Continued)

(56) References Cited

U.S. PATENT DOCUMENTS 3,516,761 A * 6/1970 Scroggins ............. F01L 25/063
                                                     417/259
3,893,790 A * 7/1975 Mayer ..................... F01L 25/04
                                                     417/346

(Continued)

FOREIGN PATENT DOCUMENTS

JP    H07-326570 A     12/1995
JP    2001332469 A  *  11/2001

(Continued)

OTHER PUBLICATIONS

Fujimoto, "Developing Apparatus and Developing Method" Nov. 2001, JP 2001-332469 Machine Translation.*

(Continued)

*Primary Examiner* — David G Cormier
*Assistant Examiner* — Thomas Bucci
(74) *Attorney, Agent, or Firm* — Posz Law Group, PLC

(57) ABSTRACT

A treatment solution supply method includes: a degassed treatment solution generating step of degassing a treatment solution by a degassing mechanism to generate a degassed treatment solution; a treatment solution storing step of storing the degassed treatment solution in a container; a filter solution-passing step of bringing a downstream side from a filter connected to a downstream side from the container via a treatment solution supply pipe to a negative pressure with respect to a pressure in the container to pass the treatment solution in the container through the filter; and a negative pressure maintaining step of maintaining a state in which the downstream side from the filter is brought to the negative pressure, for a predetermined period, after stopping supply of the treatment solution from the container to the filter.

12 Claims, 16 Drawing Sheets

(58) Field of Classification Search
USPC ........ 134/10, 184, 18, 1, 1.3, 56 R, 21, 902, 134/110, 108, 34; 210/650, 416.1, 188, 210/636, 196, 436, 767, 194; 417/313, 417/53, 2, 205, 345, 395, 259; 222/189.06, 1, 255, 52, 61
See application file for complete search history.

(56) References Cited

U.S. PATENT DOCUMENTS

| | | | | |
|---|---|---|---|---|
| 4,021,156 | A * | 5/1977 | Fuchs, Jr. | F01L 25/063 417/346 |
| 4,597,719 | A * | 7/1986 | Tano | G03F 7/16 222/571 |
| 5,096,602 | A * | 3/1992 | Yamauchi | G03C 1/74 134/26 |
| 5,167,837 | A * | 12/1992 | Snodgrass | B01D 29/15 210/134 |
| 5,262,068 | A * | 11/1993 | Bowers | B01D 35/26 210/134 |
| 5,490,765 | A * | 2/1996 | Bailey | F04B 23/025 210/416.1 |
| 5,527,161 | A * | 6/1996 | Bailey | B01D 35/26 417/53 |
| 5,772,899 | A * | 6/1998 | Snodgrass | B01D 29/15 210/136 |
| 5,900,045 | A * | 5/1999 | Wang | B01D 19/0068 95/241 |
| 5,937,876 | A * | 8/1999 | Lai | H01L 21/67051 134/110 |
| 6,113,368 | A * | 9/2000 | Hofmann | F04B 9/1174 417/53 |
| 6,171,367 | B1 * | 1/2001 | Peng | B01D 19/0031 210/188 |
| 6,238,576 | B1 * | 5/2001 | Yajima | B01D 35/26 210/194 |
| 6,328,785 | B1 * | 12/2001 | Hayashi | B01D 19/0021 95/46 |
| 6,402,821 | B1 * | 6/2002 | Matsuyama | B01D 19/0005 96/175 |
| 6,953,047 | B2 * | 10/2005 | Birtcher | B67D 7/0272 134/1.2 |
| 7,654,414 | B2 * | 2/2010 | Hiranaga | B67D 1/10 222/52 |
| 7,708,880 | B2 * | 5/2010 | Yajima | B01D 19/0068 210/167.01 |
| 7,850,431 | B2 * | 12/2010 | Gonnella | F04B 1/08 417/2 |
| 8,087,910 | B2 * | 1/2012 | Yajima | F04B 43/084 417/478 |
| 8,257,781 | B1 * | 9/2012 | Webb | C23C 18/1617 427/97.9 |
| 8,292,598 | B2 * | 10/2012 | Laverdiere | F04B 13/00 222/63 |
| 8,580,117 | B2 * | 11/2013 | Kao | G03F 7/162 210/141 |
| 8,602,750 | B2 * | 12/2013 | Takeishi | F04B 43/08 417/388 |
| 8,636,477 | B2 * | 1/2014 | Nagasaki | F04B 43/073 417/21 |
| 8,753,097 | B2 * | 6/2014 | Cedrone | F04B 15/02 137/884 |
| 9,138,784 | B1 * | 9/2015 | Hawkins | B08B 3/10 |
| 2002/0041312 | A1 * | 4/2002 | Yajima | F04B 43/00 347/85 |
| 2002/0056675 | A1 * | 5/2002 | Hegde | B01D 19/0031 210/188 |
| 2003/0150477 | A1 * | 8/2003 | Suzuki | B08B 3/00 134/1.3 |
| 2004/0094463 | A1 * | 5/2004 | Laverdiere | B01D 19/0031 210/188 |
| 2004/0144736 | A1 * | 7/2004 | Yajima | B01D 19/0068 210/805 |
| 2005/0061722 | A1 * | 3/2005 | Takao | F04B 9/02 210/137 |
| 2005/0175472 | A1 * | 8/2005 | Udagawa | B01D 19/0031 417/313 |
| 2007/0104586 | A1 * | 5/2007 | Cedrone | F04B 7/0076 417/26 |
| 2007/0119307 | A1 * | 5/2007 | Park | B01D 19/0036 96/243 |
| 2007/0125796 | A1 * | 6/2007 | Cedrone | F04B 13/00 222/14 |
| 2007/0125797 | A1 * | 6/2007 | Cedrone | F04B 13/00 222/14 |
| 2007/0128046 | A1 * | 6/2007 | Gonnella | F04B 1/08 417/2 |
| 2007/0128047 | A1 * | 6/2007 | Gonnella | F04B 13/00 417/2 |
| 2007/0131604 | A1 * | 6/2007 | Nomura | B01D 29/23 210/321.69 |
| 2007/0177998 | A1 * | 8/2007 | Kato | F04B 7/02 417/395 |
| 2008/0011781 | A1 * | 1/2008 | Yajima | B05C 11/1039 222/146.1 |
| 2008/0169230 | A1 * | 7/2008 | Nakagawa | B01D 19/0042 210/188 |
| 2011/0256041 | A1 * | 10/2011 | Ho | C23C 16/4402 423/210 |
| 2012/0241469 | A1 * | 9/2012 | Takeishi | G03F 7/16 222/1 |
| 2013/0068324 | A1 * | 3/2013 | Furusho | H01L 21/67017 137/544 |
| 2013/0280425 | A1 * | 10/2013 | Yoshida | H01L 21/02104 427/240 |
| 2013/0283929 | A1 * | 10/2013 | Ando | G01F 1/66 73/861.27 |
| 2014/0034584 | A1 * | 2/2014 | Marumoto | H01L 21/6715 210/808 |
| 2014/0216250 | A1 * | 8/2014 | Meyer | A61M 1/1658 95/22 |
| 2014/0260963 | A1 * | 9/2014 | Wang | B01D 35/02 95/8 |

FOREIGN PATENT DOCUMENTS

| | | | | |
|---|---|---|---|---|
| JP | 2003197513 | A * | 7/2003 | ......... B01D 19/0068 |
| JP | 2010135535 | A * | 6/2010 | |
| JP | 5409957 | B1 * | 2/2014 | ....... H01L 21/67017 |

OTHER PUBLICATIONS

Yajima, "Chemical Supply Device" Jul. 2003, JP 2003-197513 Machine Translation.*
Kosho, "Processing Liquid Supply Unit" Jun. 2010, JP 2010-135535 Machine Translation.*
Takayanagi "Liquid Processing Apparatus and Method" Feb. 2014, JP 5409957 Machine Translation.*

* cited by examiner

TREATMENT SOLUTION SUPPLY METHOD, NON-TRANSITORY COMPUTER-READABLE STORAGE MEDIUM, AND TREATMENT SOLUTION SUPPLY APPARATUS

CROSS REFERENCE TO RELATED APPLICATIONS

This application is based upon and claims the benefit of priority of the prior Japanese Patent Application No. 2015-71960, filed in Japan on Mar. 31, 2015, and the prior Japanese Patent Application No. 2016-11836, filed in Japan on Jan. 25, 2016, the entire contents of which are incorporated herein by reference.

BACKGROUND OF THE INVENTION

1. Field of the Invention

The present invention relates to a treatment solution supply method of supplying a treatment solution onto a substrate, a non-transitory computer-readable storage medium, and a treatment solution supply apparatus.

2. Description of the Related Art

In a photolithography step in a manufacturing process of a semiconductor device, for example, coating treatment of applying a predetermined treatment solution, for example, onto a semiconductor wafer (hereinafter, referred to as a "wafer") as a substrate to form a coating film such as an anti-reflection film, a resist film or the like, exposure processing of exposing the resist film into a predetermined pattern, developing treatment of developing the exposed resist film, and so on are sequentially performed to form a predetermined resist pattern on the wafer.

In the above-described coating treatment, fine foreign substances (particles) may be contained in the treatment solution. Further, also when particles adhere to the inside of the path such as pumps, valves and pipes of an apparatus that supplies the treatment solution, the particles may be similarly mixed into the treatment solution. Therefore, a filter is disposed in the path of the apparatus that supplies the treatment solution, and the filter removes the particles (Japanese Patent Application Laid-open No. H7-326570).

Incidentally, bubbles (gas) may be contained in the treatment solution. More specifically, when the treatment solution passes through the filter, the filter becomes a resistance to decrease the pressure of the treatment solution. Thus, bubbles occur in the treatment solution and the bubbles break free into the filter. As a result, the bubbles are mixed into the filter, so that the effective area of the filter becomes smaller to decrease the performance of the filter. Hence, it is also disclosed in the afore mentioned Japanese Patent Application Laid-open No. H7-326570 that the bubbles accumulated in the filter are discharged by a gas ventilation pipe to the outside of the filter.

SUMMARY OF THE INVENTION

However, it is possible to discharge, using the gas ventilating pipe, relatively large bubbles in the filter to the outside of the filter, but it is difficult to discharge micro-bubbles to the outside the filter.

The present invention has been made in consideration of the above points, and its object is to suppress a decrease in performance of a filter by removing micro-bubbles from the filter.

To achieve the above object, an aspect of the present invention is a treatment solution supply method of supplying a treatment solution onto a substrate, the method including: a degassed treatment solution generating step of degassing the treatment solution by a degassing mechanism to generate a degassed treatment solution; a treatment solution storing step of storing the degassed treatment solution in a container; a filter solution-passing step of bringing a downstream side from a filter connected to a downstream side from the container via a treatment solution supply pipe to a negative pressure with respect to a pressure in the container to pass the degassed treatment solution in the container through the filter; and a negative pressure maintaining step of maintaining a state in which the downstream side from the filter is brought to the negative pressure, for a predetermined period, after stopping supply of the treatment solution from the container to the filter.

The present inventors have obtained the knowledge that bringing the inside of a filter to a negative pressure when passing the treatment solution through the filter promotes separation of bubbles from the treatment solution and makes it easy to discharge the bubbles. The present invention is based on the knowledge and brings a downstream side from the filter to a negative pressure with respect to the pressure in the container in the filter solution-passing step to thereby pass the treatment solution in the container through the filter, and therefore can promote the separation and expansion in volume of the bubbles in the filter. Then, since the degassed treatment solution is passed through the filter, the bubbles separated and expanded in volume dissolve in the degassed treatment solution, whereby the bubbles are removed from the filter. Further, by maintaining the state in which the downstream side from the filter is brought to the negative pressure for a predetermined period, the removal of the bubbles is further promoted. Therefore, according to the present invention, removing the micro-bubbles from the filter makes it possible to suppress the decrease in performance of the filter.

An aspect of the present invention according to another viewpoint is a treatment solution supply method of supplying a treatment solution onto a substrate, the method including: a degassed treatment solution generating step of degassing the treatment solution by a degassing mechanism to generate a degassed treatment solution; a treatment solution storing step of storing the degassed treatment solution in a container; a filter solution-passing step of bringing a downstream side from a filter connected to a downstream side from the container via a treatment solution supply pipe to a negative pressure with respect to a pressure in the container to pass the degassed treatment solution in the container through the filter; and a both-direction degassing step of reducing a pressure from an upstream side and the downstream side from the filter to degas the treatment solution.

An aspect of the present invention according to still another viewpoint is a non-transitory computer-readable storage medium storing a program running on a computer of a control unit for controlling a treatment solution supply apparatus to cause the treatment solution supply apparatus to perform the treatment solution supply method.

Further, an aspect of the present invention according to yet another viewpoint is a treatment solution supply apparatus for supplying a treatment solution from a treatment solution supply source, via a treatment solution supply pipe, to a supply nozzle for supplying the treatment solution to a substrate, the apparatus including: a container that temporarily stores the treatment solution supplied from the treatment solution supply source and is provided on an upstream side from the supply nozzle on the treatment solution supply pipe; a degassing mechanism that is provided between the treatment solution supply source and the container on the treatment solution supply pipe and degasses the treatment solution to generate a degassed treatment solution; a filter that is provided between the container and the supply nozzle on the treatment solution supply pipe; a storage chamber variable in volume capacity connected to a branch pipe branching off from between the filter and the supply nozzle on the treatment solution supply pipe; and a control unit. The control unit is configured to: increase a volume capacity of the storage chamber to bring a downstream side from the filter of the treatment solution supply pipe to a negative pressure with respect to a pressure in the container to supply the degassed treatment solution in the container to the filter; and adjust the volume capacity of the storage chamber so as to maintain a state in which the downstream side from the filter is brought to the negative pressure, for a predetermined period, after stopping supply of the treatment solution from the container to the filter.

An aspect of the present invention according to still further another viewpoint is a treatment solution supply apparatus for supplying a treatment solution from a treatment solution supply source, via a treatment solution supply pipe, to a supply nozzle for supplying the treatment solution to a substrate, the apparatus including: a container that temporarily stores the treatment solution supplied from the treatment solution supply source and is provided on an upstream side from the supply nozzle on the treatment solution supply pipe; a degassing mechanism that is provided between the treatment solution supply source and the container on the treatment solution supply pipe and degasses the treatment solution to generate a degassed treatment solution; a filter that is provided between the container and the supply nozzle on the treatment solution supply pipe; two storage chambers variable in volume capacity connected to a branch pipe branching off from between the filter and the supply nozzle on the treatment solution supply pipe; and a control unit. The control unit is configured to: increase a volume capacity of one storage chamber of the storage chambers to bring a downstream side from the filter of the treatment solution supply pipe to a negative pressure with respect to a pressure in the container to supply the degassed treatment solution in the container to the filter; and adjust volume capacities of the two storage chambers so as to reduce a pressure from an upstream side and the downstream side from the filter to degas the treatment solution after stopping supply of the treatment solution from the container to the filter.

According to the present invention, it is possible to suppress a decrease in performance of a filter by removing micro-bubbles from the filter.

DETAILED DESCRIPTION OF THE INVENTION

Figure 1:
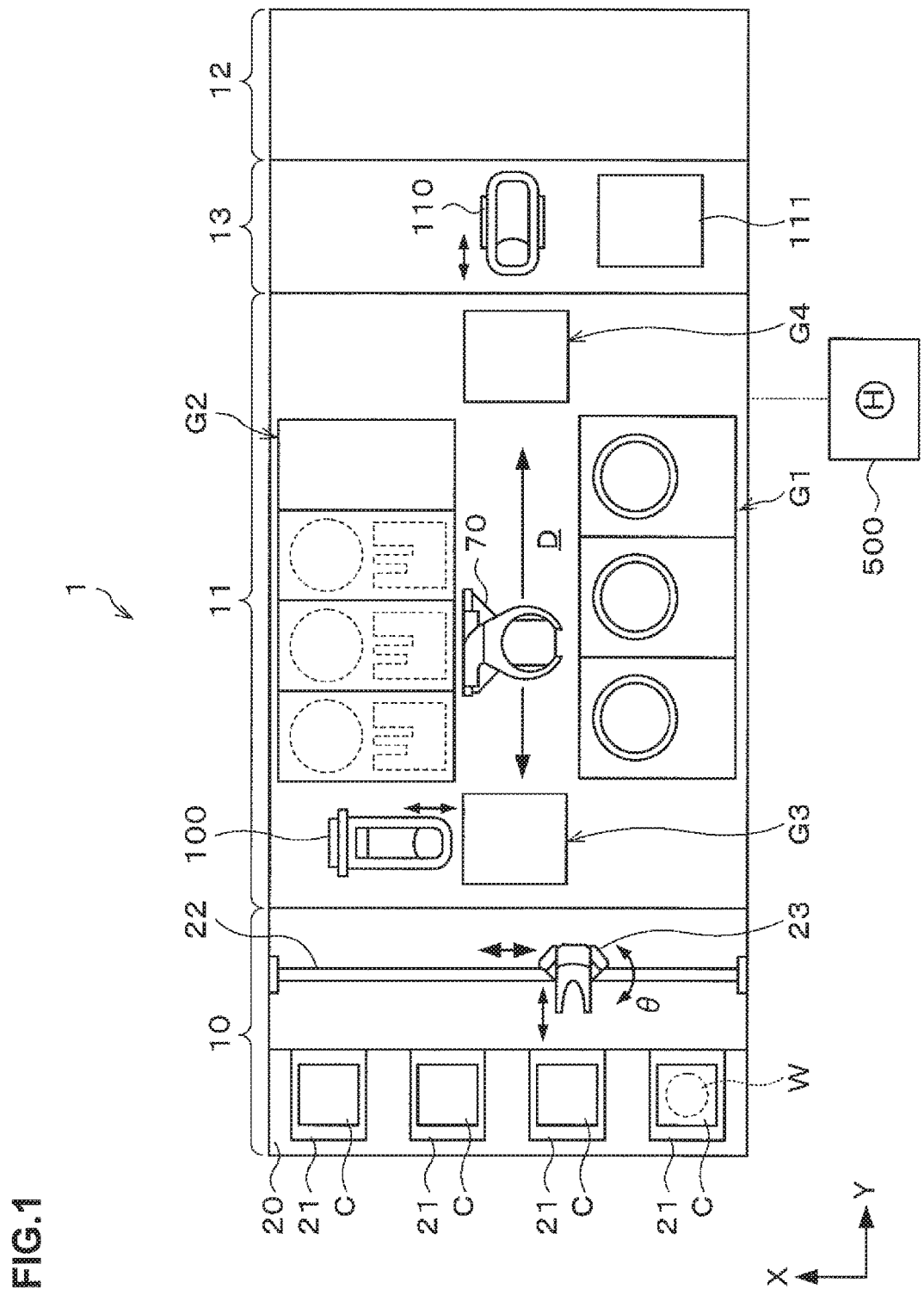
FIG. 1 is a plan view illustrating the outline of a configuration of a substrate treatment system according to an embodiment.
Figure 2:
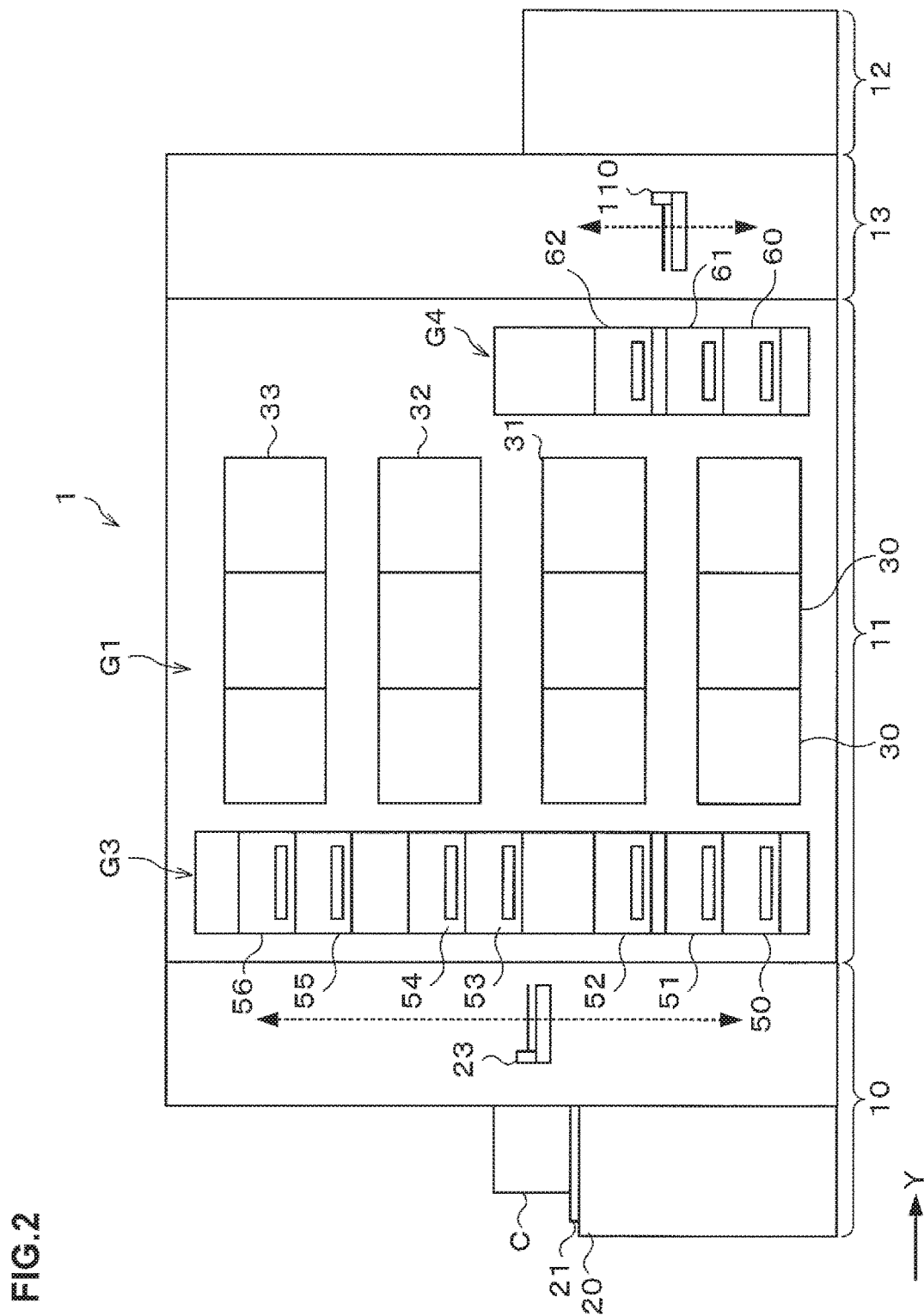
FIG. 2 is a front view illustrating the outline of the configuration of the substrate treatment system according to the embodiment.
Figure 3:
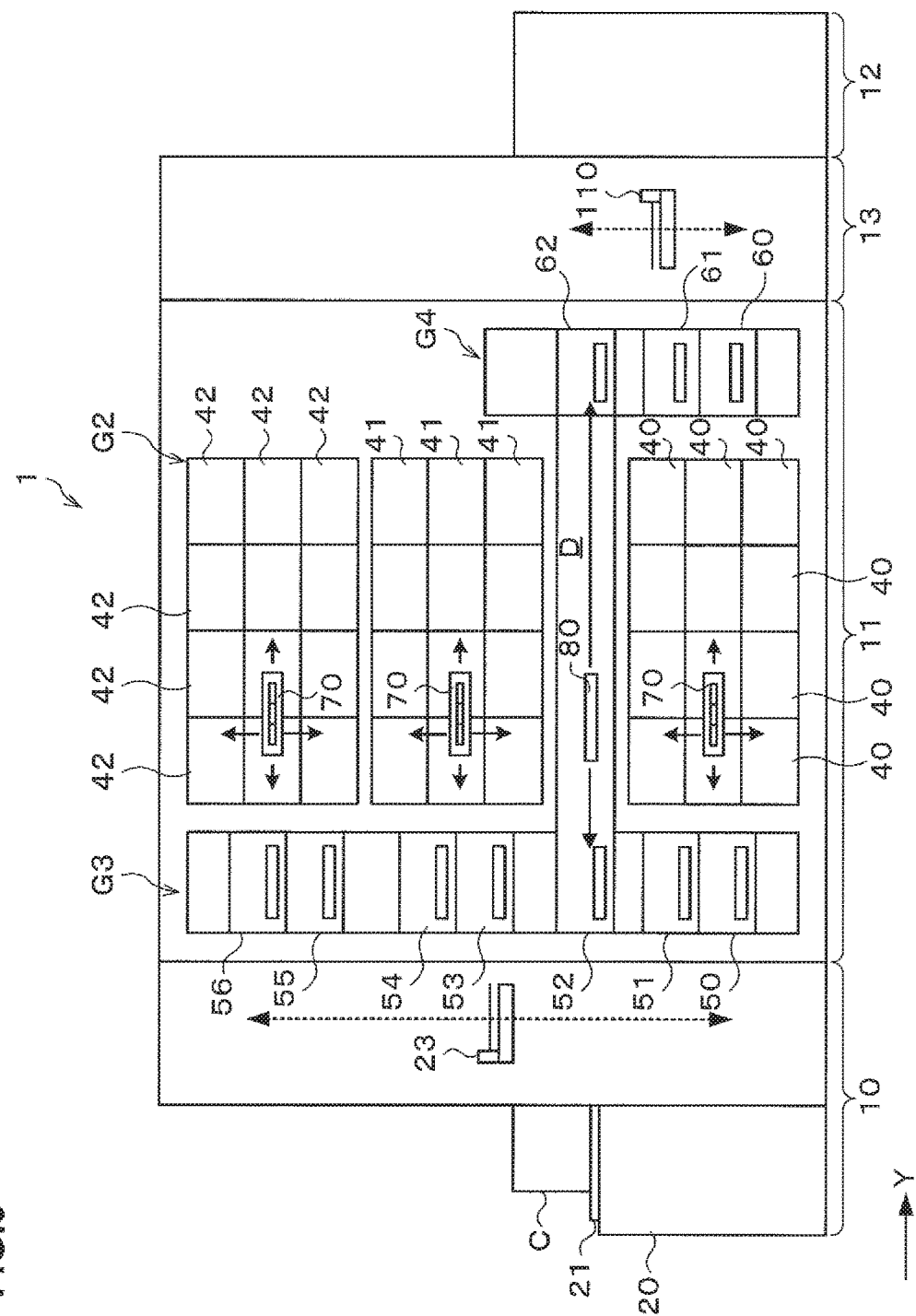
FIG. 3 is a rear view illustrating the outline of the configuration of the substrate treatment system according to the embodiment.

Hereinafter, an embodiment of the present invention will be described. FIG. 1 is an explanatory view illustrating the outline of a configuration of a substrate treatment system 1 including a treatment solution supply apparatus according to the embodiment, and FIG. 2 and FIG. 3 are a front view and a rear view schematically illustrating the outline of an internal configuration of the substrate treatment system 1 respectively. Note that in the specification and drawings, elements having substantially the same functions and configurations are denoted by the same reference signs, whereby redundant descriptions are omitted.

The substrate treatment system 1 has a configuration, as illustrated in FIG. 1, in which a cassette station 10 into/out of which a cassette C housing a plurality of wafers W is transferred, a treatment station 11 including a plurality of various treatment apparatuses which perform predetermined treatments on the wafer W, and an interface station 13 for delivering the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (an X-direction negative direction side in FIG. 1) in the treatment station 11, and the second block G2 is provided on the rear side (an X-direction positive direction side in FIG. 1) in the treatment station 11. Further, the third block G3 is provided on the cassette station 10 side (a Y-direction negative direction side in FIG. 1) in the treatment station III, and the fourth block G4 is provided on the interface station 13 side (a Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution onto the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in order from the bottom.

For example, three pieces of each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

For example, in the solution treatment apparatuses such as the developing treatment apparatus 30, the lower anti-reflection film forming apparatus 31, the resist coating apparatus 32, and the upper anti-reflection film forming apparatus 33, for example, spin-coating of applying a predetermined treatment solution onto the wafer W is performed. In the spin-coating, the treatment solution is discharged from, for example, a coating nozzle onto the wafer W and the wafer W is rotated, whereby the treatment solution is diffused on the front surface of the wafer W. Note that the configurations of the solution treatment apparatuses will be described later.

For example, in the second block G2, as illustrated in FIG. 3, thermal treatment apparatuses 40 each of which performs thermal treatment such as heating and cooling on the wafer W, adhesion apparatuses 41 each for enhancing fixation between the resist solution and the wafer W, and edge exposure apparatuses 42 each of which exposes the outer peripheral portion of the wafer W, are arranged one above the other in the vertical direction and side by side in the horizontal direction. The numbers and the arrangement of the thermal treatment apparatuses 40, the adhesion apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

In a region surrounded by the first block G1 to the fourth block G4, a wafer transfer region D is formed as illustrated in FIG. 1. In the wafer transfer region D, for example, a plurality of wafer transfer apparatuses 70 are arranged each of which has a transfer arm that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

In the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent, on the X-direction positive direction side, to the third block G3. The wafer transfer apparatus 100 has a transfer arm that is movable, for example, in the X-direction, the θ-direction, and the vertical direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm that is movable, for example, in the Y-direction, the θ-direction, and the vertical direction. The wafer transfer apparatus 110 can transfer the wafer W to/from each of the delivery apparatuses in the fourth block G4, the delivery apparatus 111 and the exposure apparatus 12, for example, while supporting the wafer W by the transfer arm.

Figure 4:
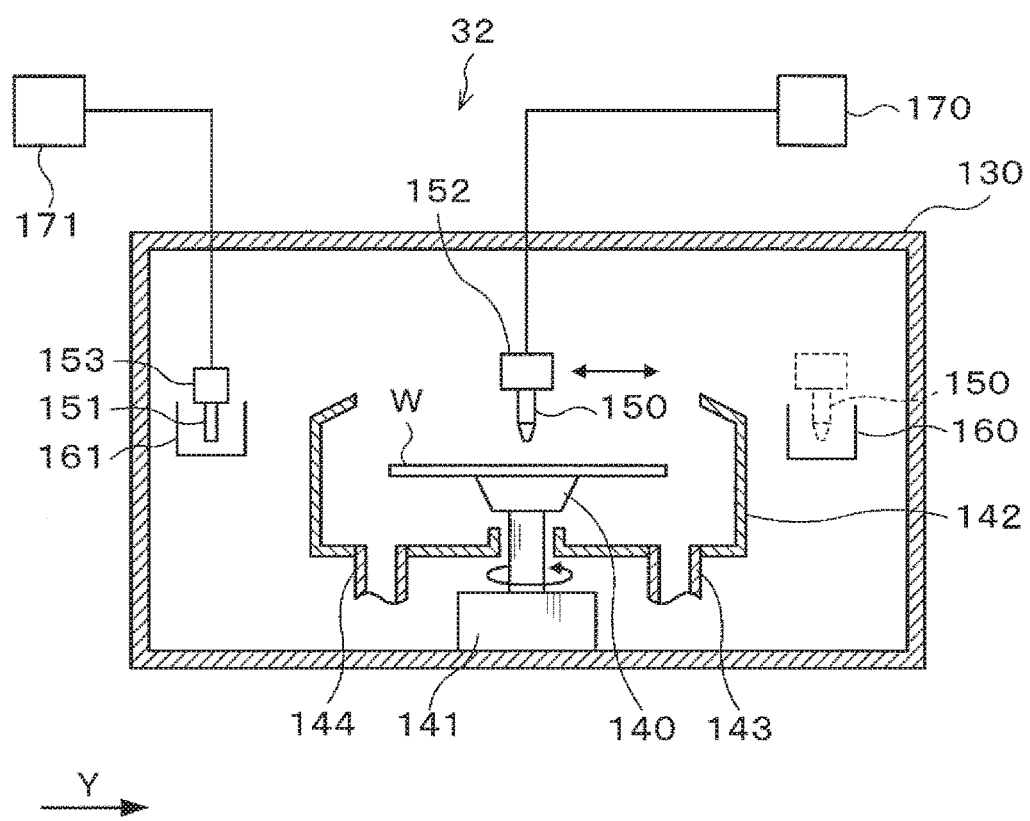
FIG. 4 is a longitudinal sectional view illustrating the outline of a configuration of a resist coating apparatus.

Next, the configurations of the above-described solution treatment apparatuses will be described. Note that the configuration of the resist coating apparatus 32 will be described as an example of the solution treatment apparatus in the embodiment. The resist coating apparatus 32 has a treatment container 130 whose inside is sealable as illustrated in FIG. 4. In a side surface of the treatment container 130, a transfer-in/out port (not illustrated) for the wafer W is formed.

In the treatment container 130, a spin chuck 140 is provided as a substrate holding unit which holds and rotates the wafer W thereon. The spin chuck 140 can rotate at a predetermined speed by means of a chuck drive unit 141 such as a motor. Further, the chuck drive unit 141 is provided with a raising and lowering drive mechanism such as a cylinder, and therefore the spin chuck 140 can freely rise and lower.

Around the spin chuck 140, a cup 142 is provided which receives and collects liquid splashing or dropping from the wafer W. A discharge pipe 143 that discharges the collected liquid and an exhaust pipe 144 that exhausts the atmosphere in the cup 142 are connected to the lower surface of the cup 142.

Further, in the treatment container 130, a resist solution supply nozzle 150 that supplies a resist solution and a thinner supply nozzle 151 that supplies a thinner as a treatment solution are provided. The resist solution supply nozzle 150 and the thinner supply nozzle 151 are supported on an arm 152 and an arm 153 respectively. Each of the arms 152, 153 is configured to freely move along a Y-direction in FIG. 4 by a not-illustrated drive mechanism. Thus, the resist solution supply nozzle 150 is configured to freely move between a waiting section 160 provided outside the cup 142 and a position above the wafer W. Similarly, the thinner supply nozzle 151 is also configured to freely move between a waiting section 161 provided outside the cup 142 and a position above the wafer W.

The arms 152, 153 freely move by the drive mechanisms (not illustrated) to be able to adjust the heights of the resist solution supply nozzle 150 and the thinner supply nozzle 151.

To the resist solution supply nozzle 150, a resist solution supply apparatus 170 is connected which supplies a resist solution to the resist solution supply nozzle 150. Further, to the thinner supply nozzle 151, a thinner supply apparatus 171 as a treatment solution supply apparatus is connected which supplies a thinner to the thinner supply nozzle 151.

Figure 5:
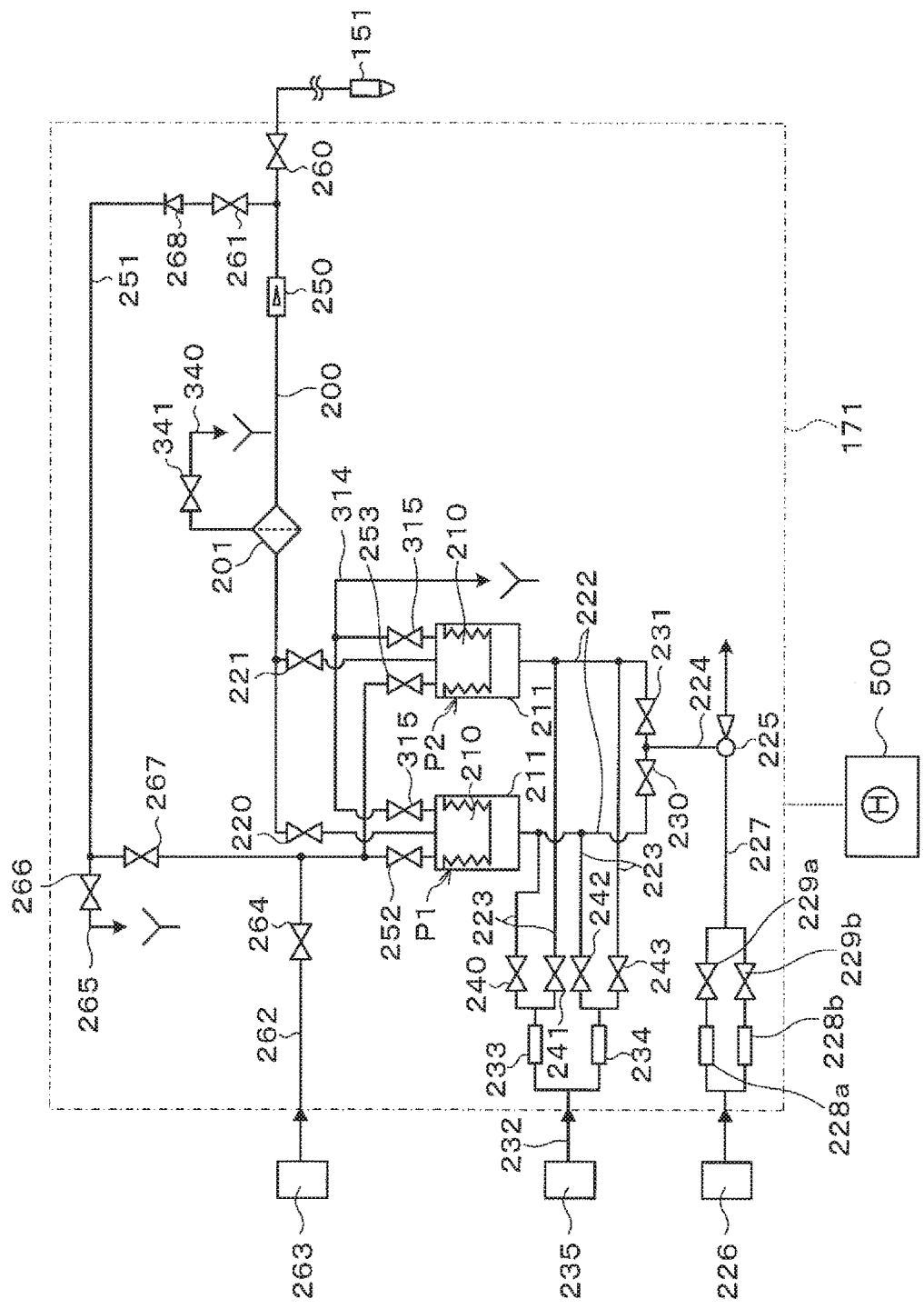
FIG. 5 is a pipe system diagram illustrating the outline of a configuration of a thinner supply apparatus.

Next, the configuration of the thinner supply apparatus 171 will be described. FIG. 5 is a pipe system diagram illustrating the outline of a configuration of the thinner supply apparatus 171.

The thinner supply apparatus 171 includes pumps P1, P2 that supply a thinner as a treatment solution to the thinner supply nozzle 151 via a thinner supply pipe 200 as a treatment solution supply pipe, and a filter 201 that is provided on the downstream side from the pumps P1, P2 and on the upstream side from the thinner supply nozzle 151 on the thinner supply pipe 200, namely, between the pumps P1, P2 and the thinner supply nozzle 151 and removes foreign substances and bubbles mixed in the thinner. Note that the side of the pumps P1, P2 of the thinner supply pipe 200 is sometimes referred to as an upstream side and the side of the thinner supply nozzle 151 of the thinner supply pipe 200 is sometimes referred to as a downstream side hereafter.

The pump P1, P2 pressure-feeds the thinner to the thinner supply nozzle 151 and also functions as a container that temporarily stores the thinner supplied from a later-described thinner supply source 263, and includes a storage chamber 210 variable in volume capacity, and a pressure chamber 211 that is adjacent to the storage chamber 210 and feeds/exhausts nitrogen gas or the like to/from the inside of the storage chamber 210 to thereby vary the volume capacity of the storage chamber 210. Note that details of the configurations of the pumps P1, P2 and the filter 201 will be described later.

The thinner supply pipe 200 branches off on the upstream side from the filter 201 and is connected to the storage chambers 210 of the pumps P1, P2. On the upstream side from the branch point of the thinner supply pipe 200, switching valves 220, 221 are provided. By opening/closing the switching valves 220, 221, the connection state between the thinner supply pipe 200 and the storage chambers 210 can be operated.

To the pressure chambers 211 of the pumps P1, P2, feed/exhaust pipes 222 are connected. To the feed/exhaust pipe 222, a feed pipe 223 that supplies, for example, a nitrogen as a pressurizing gas to the pressure chamber 211 and an exhaust pipe 224 that exhausts gas in the pressure chamber 211 are connected.

The feed/exhaust pipes 222 connected to the pressure chambers 211 of the pumps P1 P2 join, fin example, at end portions on the opposite side to the pressure chambers 211 side, and the one exhaust pipe 224 is connected to the joined feed/exhaust pipes 222. On an end portion of the exhaust pipe 224 on the opposite side to the feed/exhaust pipes 222 side, an air ejector 225 is connected. To the air ejector 225, a drive air source 226 that drives the air ejector 225 is connected via a drive air pipe 227.

The drive air pipe 227 is provided with regulators 228a, 228b in parallel with each other which regulate the flow rate of the drive air flowing through the drive air pipe 227. On the downstream side from the regulators 228a, 228b, switching valves 229a, 229b are provided. The regulators 228a, 228b are set to respective different flow rates so that the flow rate of the drive air to be supplied to the air ejector 225 can be regulated by an operation of opening/closing the switching valves 229a, 229b. This makes it possible to regulate the vacuum pressure to be generated in the air ejector 225. Further, a switching valve 230 is provided on the pump P1 side from the junction of the feed/exhaust pipe 222 with the exhaust pipe 224, and a switching valve 231 is provided on the pump P2 side from the junction. By an operation of opening/closing the switching valves 230, 231, from which of the pressure chambers 211 of the pump P1 and the pump P2 the gas is to be exhausted can be selected.

The feed pipes 223 are connected to two points of the feed/exhaust pipe 222 between the switching valve 230 and the pump P1 and to two points of the feed/exhaust pipe 222 between the switching valve 231 and the pump P2. In other words, four feed pipes 223 in total are provided as illustrated in FIG. 5 in the embodiment. Further, the feed pipes 223 connected between the switching valve 230 and the pump P1 join at end portions on the opposite side to the feed/exhaust pipe 222 side, the feed pipes 223 connected between the switching valve 231 and the pump P2 join at end portions on the opposite side to the feed/exhaust pipe 222 side, and gas supply pipes 232 that supply a pressurizing gas are connected to the joined feed pipes 223 respectively.

The gas supply pipes 232 are respectively provided with regulators 233, 234 that regulate the flow rates of the pressurizing gas flowing through the gas supply pipes 232. The regulators 233, 234 are set to respective different flow rates. The gas supply pipes 232 join on the upstream side from the regulators 233, 234, and to the gas supply pipe 232 after joining, a gas supply source 235 that supplies the pressurizing gas to the gas supply pipe 232 is connected. Further, on the feed/exhaust pipe 222 side from the connection points of the feed pipes 223 with the gas supply pipes 232, switching valves 240, 241, 242, 243 are provided respectively. Accordingly; by operating the switching valves 240, 241, 242, 243, the flow rates of the pressurizing gas to be supplied to the feed/exhaust pipes 222 via the feed pipes 223 can be regulated.

Between the filter 201 and the thinner supply nozzle 151 in the thinner supply pipe 200, a flow rate measuring mechanism 250 is provided which measures the flow rate of the thinner passing through the filter 201. A circulation pipe 251 is provided branching from between the flow rate measuring mechanism 250 and the thinner supply nozzle 151. An end portion of the circulation pipe 251 on the opposite side to the thinner supply pipe 200 side branches off, and the branches are connected to the storage chamber 210 of the pump P1 and the storage chamber 210 of the pump P2 respectively. A switching valve 252 is provided on the pump P1 side from the branch point of the circulation pipe 251, and a switching valve 253 is provided on the pump P2 side from the branch point. Further, a supply switching valve 260 is provided on the downstream side from the branch point of the thinner supply pipe 200 from the circulation pipe 251, and a circulation switching valve 261 is provided on the downstream side from the branch point of the circulation pipe 251 from the thinner supply pipe 200 and on the upstream side from the switching valves 252, 253. Accordingly, by bringing the supply switching valve 260 into a closed state and the circulation switching valve 261 into an open state, then bringing, for example, the switching valve 252 on the pump P1 side into a closed state and the switching valve 253 on the pump P2 side into an open state, and discharging the thinner from the pump P1, the thinner can be circulated to the storage chamber 210 of the pump P2.

Further, a replenishment pipe 262 is connected to between the circulation switching valve 261 and the switching valves 252, 253 on the circulation pipe 251. To an end portion of the replenishment pipe 262 on the opposite side to the circulation pipe 251, the thinner supply source 263 is connected which supplies the thinner to the pumps P1, P2. Accordingly, the thinner can be supplied from the thinner supply source 263 to the pumps P1, P2 via the replenishment pipe 262 and the circulation pipe 251. The replenishment pipe 262 is provided with a replenishment valve 264 that controls the supply of the thinner from the thinner supply source 263.

For example, a drain pipe 265 that drains the thinner in the circulation pipe 251 to the outside of the system is provided branching from between the junction of the circulation pipe 251 and the replenishment pipe 262 and the circulation switching valve 261. The drain pipe 265 is provided with a drain valve 266. Further, a drain switching valve 267 is provided on the pumps P1, P2 side from the junction between the drain pipe 265 and the circulation pipe 251. Therefore, by bringing the drain switching valve 267 into a closed state and the drain valve 266 into an open state, the thinner in the circulation pipe 251 can be drained to the outside of the system. Further, a check valve 268 for preventing a reverse flow of the thinner is provided between the junction of the circulation pipe 251 and the drain pipe 265 and the circulation switching valve 261.

Next, the configurations of the pumps P1, P2 will be described. Note that since the configurations of the pumps P1, P2 are the same in the embodiment, the pump P1 will be described below and the description of the pump P2 will be omitted.

Figure 6:
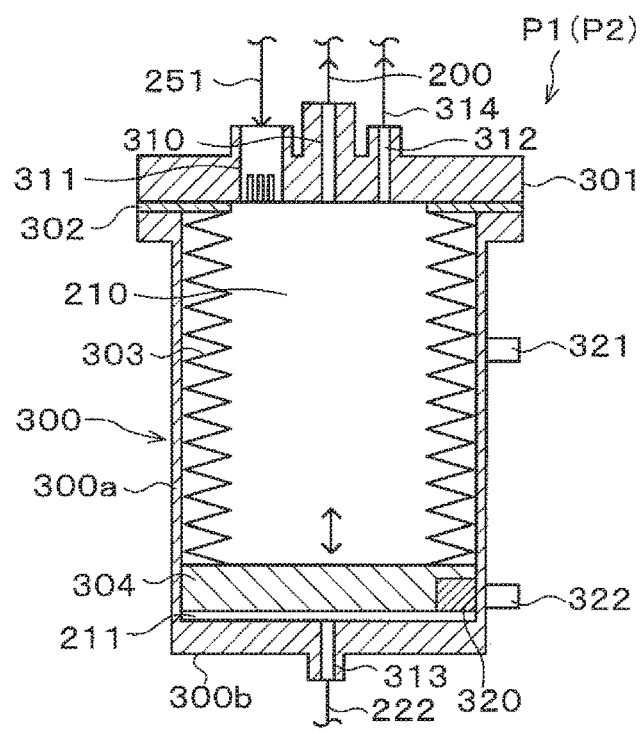
FIG. 6 is an explanatory view of a longitudinal section illustrating the outline of a configuration of a pump.

The pump P1 includes, as illustrated in FIG. 6, a casing 300 in a substantially cylindrical shape with a bottom and an open upper part, a lid body 301 disposed at an upper end portion of the casing 300, a bellows 303 disposed in the casing 300 and in air-tight contact with the lower surface of the lid body 301 via a support plate 302, and a piston plate 304 air-tightly connected to a lower end portion of the bellows 303.

The bellows 303 is disposed to expand and contract along a direction of the height of the casing 300. The piston plate 304 has a substantially disk shape in abutment with an inside surface of a side wall 300a of the casing 300, and is arranged in parallel with the lid body 301 and a bottom plate 300b of the casing 300. Further, the piston plate 304 is configured to freely slide along a direction in which the side wall 300a extends (a vertical direction in FIG. 6) while keeping the airtightness with respect to the inside surface of the side wall 300a. A space surrounded by the lid body 301, the bellows 303, and the piston plate 304 forms the storage chamber 210. Similarly, a space surrounded by the piston plate 304, the side wall 300a, and the bottom plate 300b forms the pressure chamber 211.

Figure 7:
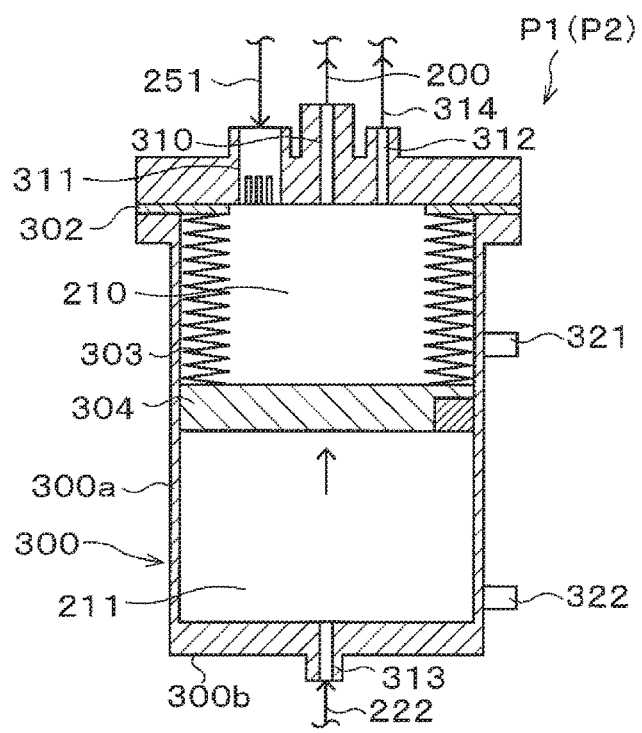
FIG. 7 is an explanatory view of a longitudinal section illustrating the outline of the configuration of the pump.

The lid body 301 is formed with a discharge port 310, a degassing nozzle 311 as a degassing mechanism, and a drain port 312 which penetrate the lid body 301. The thinner supply pipe 200 is connected to the discharge port 310, and the circulation pipe 251 is connected to the degassing nozzle 311. The bottom plate 300b of the casing 300 is formed with a connection port 313 penetrating the bottom plate 300b. To the connection port 313, the feed/exhaust pipe 222 is connected. Accordingly, supplying the pressurizing gas to the pressure chamber 211 from the gas supply source 235 via the feed/exhaust pipe 222 makes it possible to pressurize the inside of the pressure chamber 211 to thereby push up the piston plate 304 in a direction of the lid body 301, for example, as illustrated in FIG. 7. This reduces the volume capacity of the storage chamber 210 and thereby can pressure-feed the fluid in the storage chamber 210, that is, the thinner in the embodiment, from the discharge port 310. Contrarily, exhausting gas inside the pressure chamber 211 via the feed/exhaust pipe 222 by the air ejector 225 makes it possible to pull in the piston plate 304 in a direction of the bottom plate 300b. This increases the volume capacity of the storage chamber 210, in other words, brings the inside of the storage chamber 210 to a negative pressure and thereby can draw in the thinner into the storage chamber 210 via the degassing nozzle 311.

Further, to the drain port 312 of the lid body 301, a discharge pipe 314 is connected which discharges the thinner in the storage chamber 210 to the outside the system. The discharge pipe 314 is provided with a discharge valve 315 as illustrated in FIG. 5. Accordingly, by bringing, for example, the switching valve 220 and the switching valve 252 into a closed state and the discharge valve 315 into an open state and pressurizing the inside of the pressure chamber 211, the thinner in the storage chamber 210 can be discharged to the outside of the system.

The degassing nozzle 311 is configured to have a flow path area on the storage chamber 210 side smaller than a flow path area on the circulation pipe 251 side. Accordingly, for example, when the thinner is supplied from the thinner supply source 263 and the thinner flows from the circulation pipe 251 side to the storage chamber 210 side of the degassing nozzle 311, the flow rate of the thinner increases toward the storage chamber 210 side. This decreases the static pressure of the thinner inside the degassing nozzle 311 to remove gas dissolving in the thinner. Thus, a degassed thinner being a treatment solution degassed by the degassing nozzle 311 and the gas separated from the degassed thinner are introduced into the storage chamber 210. Note that the arrangement of the degassing nozzle 311 is not limited to the contents of the embodiment, but the degassing nozzle 311 may be provided separately from the lid body 301 as long as it can supply the degassed thinner into the storage chamber 210. Concretely, the degassing nozzle 311 may be provided independently, for example, on the pump P1 side from the junction of the circulation pipe 251 with the replenishment pipe 262.

At an outer peripheral portion of the piston plate 304, a magnet 320 is embedded. Further, on the outside of the side wall 300a of the casing 300, sensors 321, 322 that detect the magnetic field of the magnet 320 are provided in a manner to face the magnet 320 in this order from upper to lower in FIG. 6. The sensor 321 is provided at a height corresponding to the position (top dead center) of the piston plate 304, for example, when the bellows 303 contracts to the limit. Accordingly, the sensor 321 can detect the fact that the thinner cannot be discharged any longer from the pump P1. In other words, the fact that the inside of the pump P1 (storage chamber 210) has emptied can be detected. The sensor 322 is provided at a height corresponding to substantially a bottom dead center of the piston plate 304, and can detect the fact that the volume capacity inside the storage chamber 210 has increased to almost the maximum. In other words, the fact that the inside of the pump P1 (storage chamber 210) has been charged with the thinner.

Figure 8:
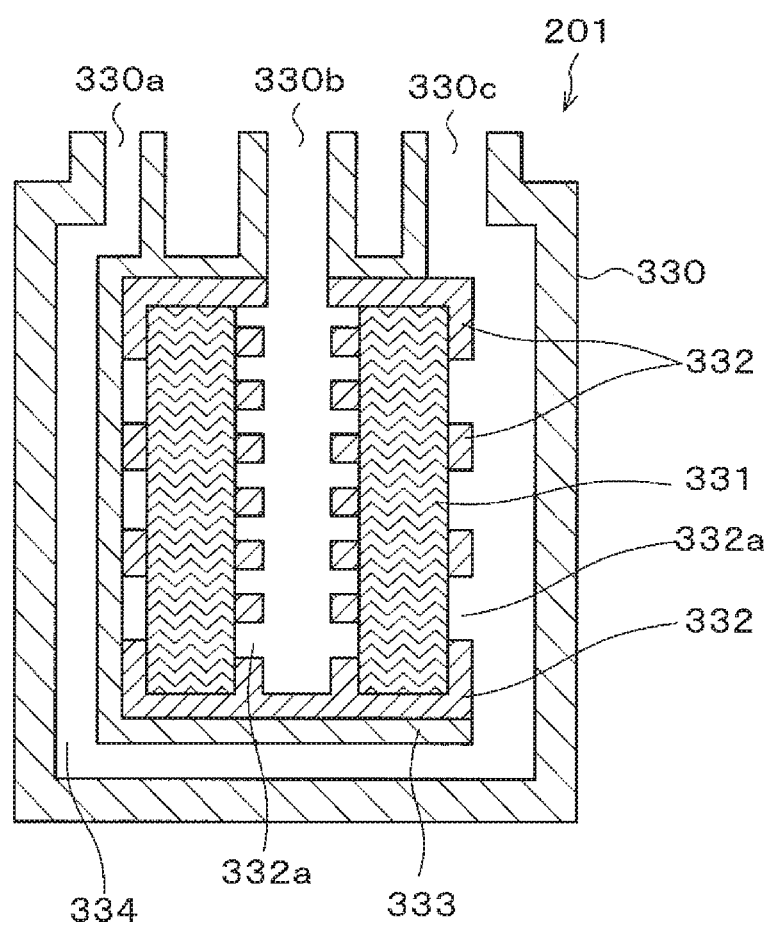
FIG. 8 is an explanatory view of a longitudinal section illustrating the outline of a configuration of a filter.

Next, the configuration of the filter 201 will be described. The filter 201 has, as illustrated in FIG. 8, a casing 330 in a substantially cylindrical shape with a bottom and an open upper part, a filter element 331 that is provided in the casing 330 and filters out and catches foreign substances and bubbles, a filter housing member 332 that houses the filter element 331, and a holding member 333 that holds the filter housing member 332. An upper portion of the casing 330 is formed with an introduction port 330a through which the thinner supplied from the pumps P1, P2 is introduced into the inside of the casing 330, a discharge port 330b through which the thinner filtered by the filter element 331 to the outside of the casing 330, and a drain port 330c through which the thinner not filtered by the filter element 331 to the outside of the casing 330 as it is.

The filter element 331 has a substantially cylindrical shape and is made of nylon, polyethylene or the like. The filter housing member 332 is configured to cover the inside surface and the outside surface of the filter element 331. The filter housing member 332 is formed with a plurality of through holes 332a at places corresponding to the inside side surface and the outside side surface of the filter element 331.

The holding member 333 is configured such that at least a part of the through holes 332a of the filter housing member 332 are not closed in a state in which the holding member 333 holds the filter housing member 332. Further, the holding member 333 is disposed at a position where the filter element 331 is substantially coaxial with the casing 330.

Further, between the outer surface of the holding member 333 or filter housing member 332 and the casing 330, a predetermined clearance is funned which functions as a flow passage way 334 through which the thinner introduced from the introduction port 330a flows.

To the introduction port 330a and the discharge port 330b, the thinner supply pipe 200 is connected, so that the thinner introduced from the introduction port 330a and passed through the filter element 331 is discharged from the discharge port 330b. Further, to the drain port 330c, a vent pipe 340 is connected as illustrated in FIG. 5 and, for example, by bringing the supply switching valve 260 and the circulation switching valve 261 into a closed state and pressure-feeding the thinner from the pump P1 or the pump P2, the thinner and the gas in the casing 330 can be discharged from the drain port 330c to the vent pipe 340. The vent pipe 340 is provided with a vent valve 341.

Note that the configurations of the developing treatment apparatus 30, the lower anti-reflection film forming apparatus 31, and the upper anti-reflection film forming apparatus 33 which are the other solution treatment apparatuses, are the same as that of the above-described resist coating apparatus 32 except that the shape and the number of the nozzles and the solution to be supplied from the nozzle are different, and therefore description thereof is omitted.

In the above substrate treatment system 1, a control unit 500 is provided as illustrated in FIG. 1, The control unit 500 is, for example, a computer and has a program storage unit (not illustrated). In the program storage unit, a program for controlling the treatment on the wafer W in the substrate treatment system 1 is stored. Further, a program fir controlling operations of the above-described various treatment apparatuses and driving systems such as the transfer mechanisms to realize a later-described substrate treatment in the substrate treatment system 1 is also stored. Note that the programs may be the ones that are recorded, for example, in a computer-readable storage medium H such as a computer-readable hard disk (HD), flexible disk (FD), compact disk (CD), magneto-optical disk (MO), or memory card, and installed from the storage medium into the control unit 500.

Note that as the valves provided in the thinner supply apparatus 171, the ones that can be automatically opened and closed by remote control, such as electromagnetic valves, air-operated valves or the like are used unless otherwise stated. In addition, all of the valves and the sensors 321, 322 and so on are electrically connected to the control unit 500, and their state monitoring and operations are appropriately performed by the control unit 500.

The substrate treatment system 1 according to the embodiment is configured as described above. Next, a wafer treatment performed using the substrate treatment system 1 will be described.

First, the cassette C housing a plurality of wafers W is transferred into the cassette station 10 of the substrate treatment system 1 and the wafers W in the cassette C are sequentially taken out by the wafer transfer apparatus 23 and transferred to the delivery apparatus 53 in the treatment station 11.

Then, the wafer W is transferred to the thermal treatment apparatus 40 in the second block G2 and temperature-regulated. Thereafter, the wafer W is transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 40 in the second block G2 and heated and temperature-regulated.

Then, the wafer W is transferred to the adhesion apparatus 41 and subjected to adhesion treatment. The wafer W is then transferred to the resist coating apparatus 32 in the first block G1, in which a resist film is formed on the wafer W.

Figure 9:
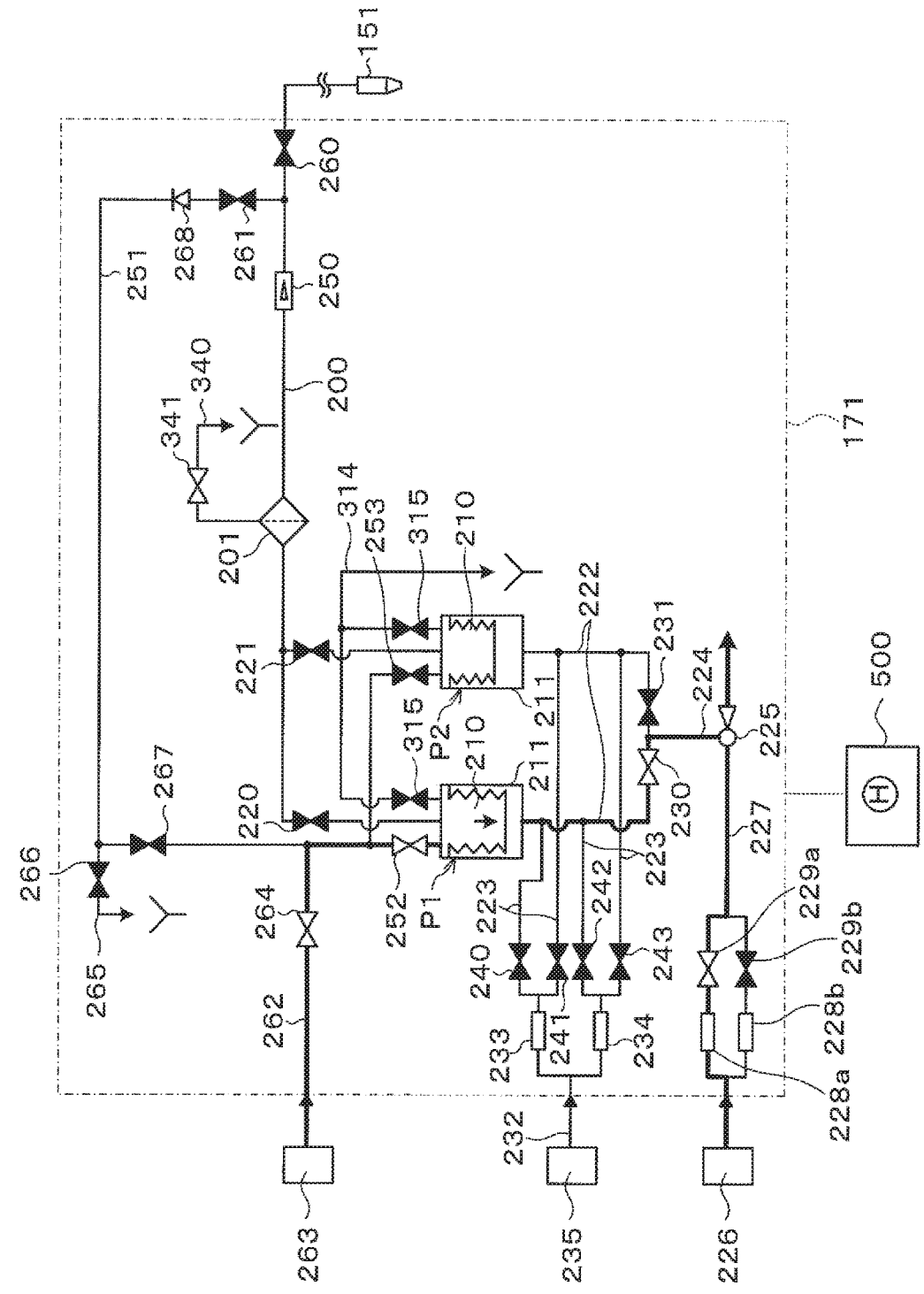
FIG. 9 is an explanatory view illustrating a pipe system for explaining the outline of a configuration of a thinner supply apparatus in a state in which a degassed treatment solution generating step and a treatment solution storing step are implemented.

Here, the resist coating treatment in the resist coating apparatus 32 will be described in detail. For the resist coating treatment, a degassed thinner is generated in advance. For generating the degassed thinner, for example, as illustrated in FIG. 9, the switching valves 220, 221, 253, the drain switching valve 267, and the discharge valve 315 are brought into a closed state and the replenishment valve 264 and the switching valve 252 are brought into an open state to supply the thinner from the thinner supply source 263, for example, into the pump P1. Thus, the degassing nozzle 311 degasses the thinner to generate the degassed thinner as a degassed treatment solution (degassed treatment solution generating step), and the degassed thinner is stored in the storage chamber 210 of the pump P1 (treatment solution storing step). Further, when the thinner is supplied from the thinner supply source 263, the switching valve 230 is brought into an open state and the switching valve 231 is brought into a closed state, and the air ejector 225 is driven, fix; example, using the system of the regulator 228a to bring the pressure chamber 211 to a negative pressure to thereby push down the piston plate 304. Note that in FIG. 9 and FIG. 14 subsequent thereto, the closed state is indicated by blackening and the pipes through which fluids such as the thinner and gas flow are indicated with heavy lines to omit the description of the open and closed states of the other valves.

Figure 10:
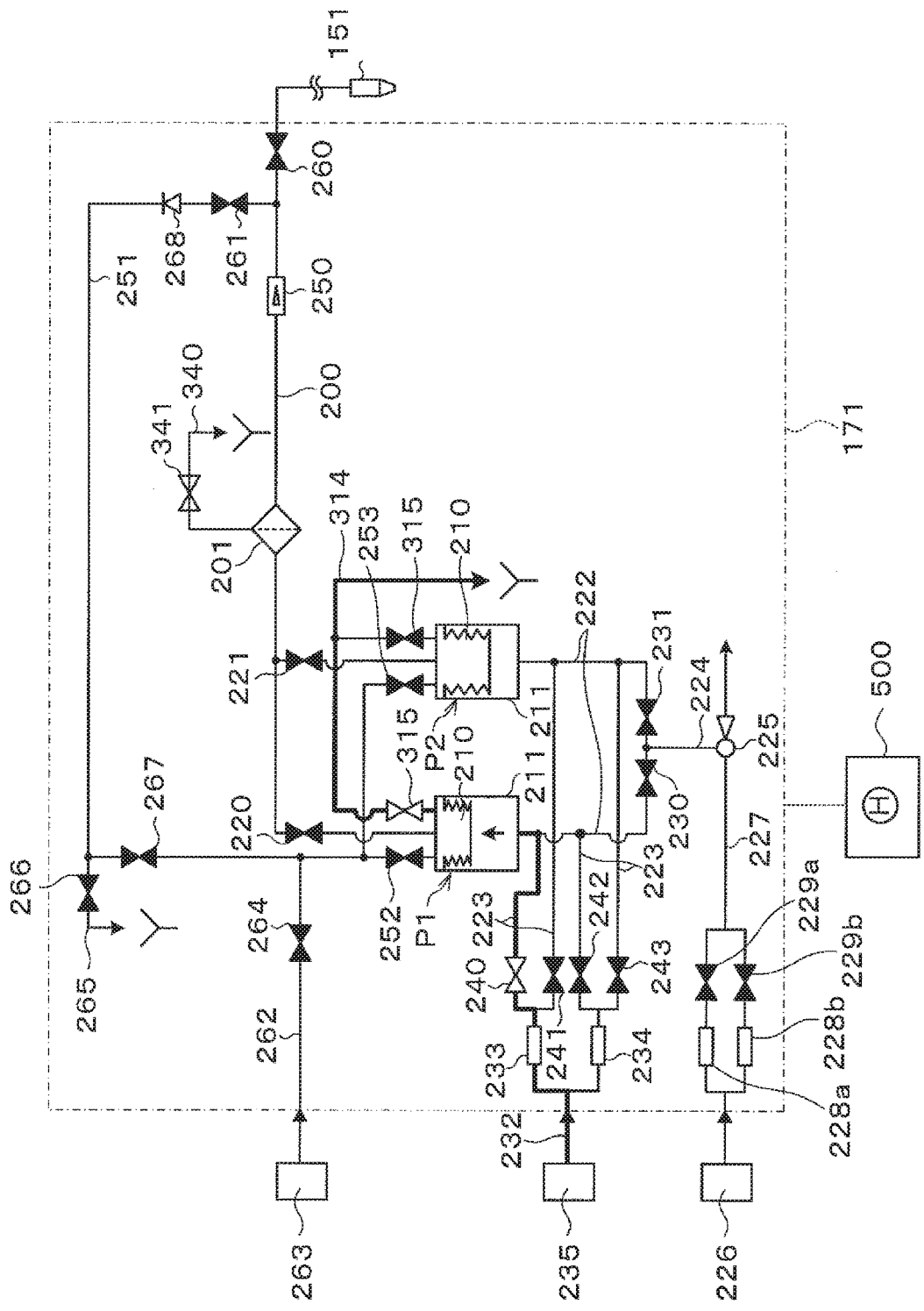
FIG. 10 is an explanatory view illustrating the pipe system for explaining the outline of the configuration of the thinner supply apparatus in a state in which a treatment solution discharging step is implemented.

Note that in the case where the thinner remains in the storage chamber 210 of the pump P1, the discharge valve 315 of the system of the pump P1 may be brought into an open state and the pressurizing gas may be supplied from the gas supply source 235, for example, using the system of the regulator 233 to pressurize the inside of the pressure chamber 211 of the pump P1, for example, as illustrated in FIG. 10 and thereby discharge the thinner in the storage chamber 210 from the discharge pipe 314 (treatment solution discharging step) before the degassed treatment solution generating step is performed.

Figure 11:
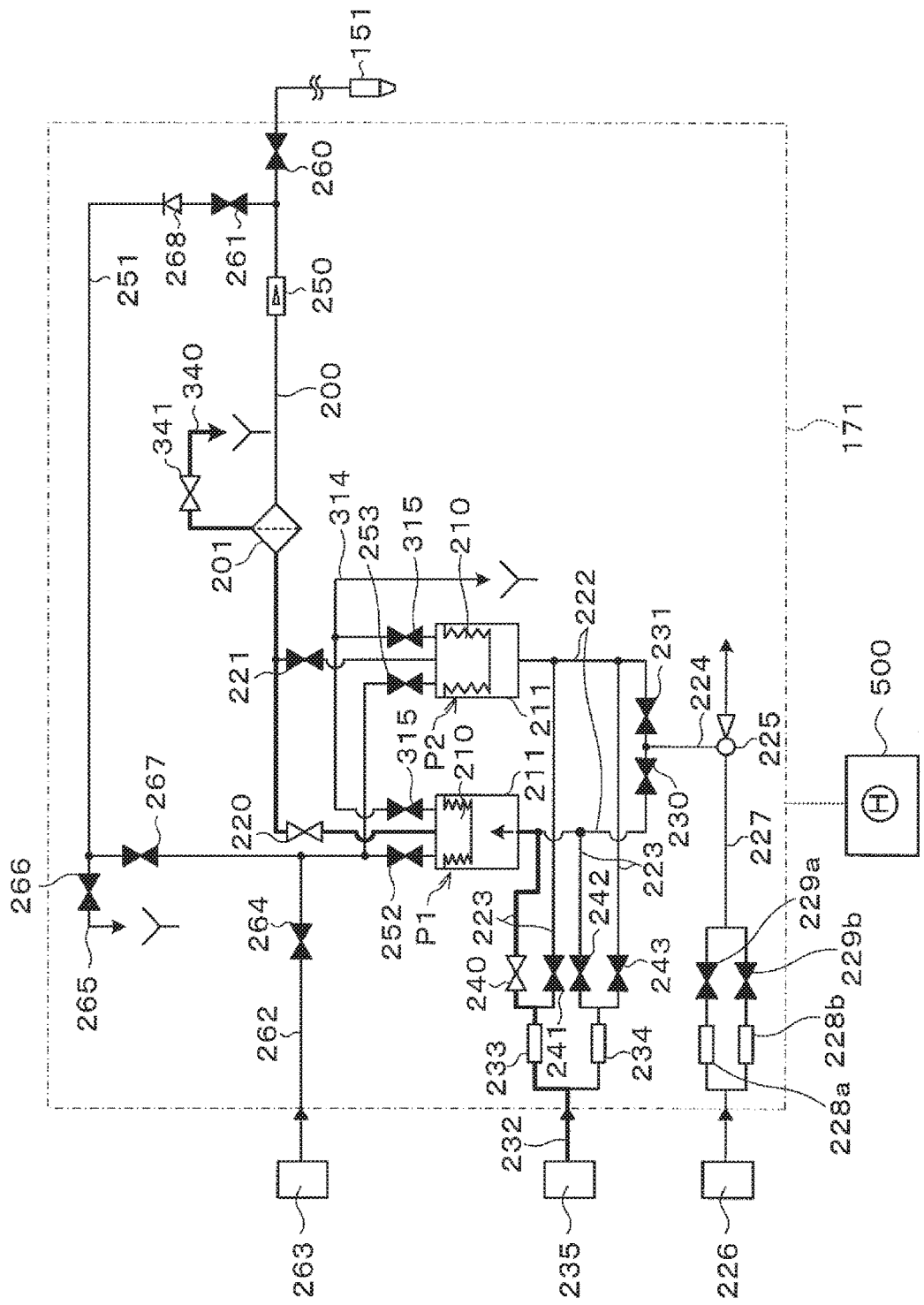
FIG. 11 is an explanatory view illustrating the pipe system for explaining the outline of the configuration of the thinner supply apparatus in a state in which gas separated from the thinner is being discharged from a vent pipe.

Next, as illustrated in FIG. 11, the air ejector 225 is stopped and the replenishment valve 264 and the switching valve 252 are switched to a closed state, and then the switching valve 220 is brought into an open state. Then, the pressurizing gas is supplied from the gas supply source 235, for example, using the system of the regulator 233 to pressurize the inside of the pressure chamber 211 of the pump P1. In this event, the supply switching valve 260 and the circulation switching valve 261 are brought into a closed state and the vent valve 341 provided for the filter 201 is brought into an open state, and the thinner in the storage chamber 210 is pressure-fed from the pump P1 to the thinner supply pipe 200. Thus, the thinner in the storage chamber 210 and the gas separated from the thinner by the degassing nozzle 311 are discharged from the vent pipe 340, and the thinner supply pipe 200 on the upstream side from the filter 201 is filled with the degassed thinner. Note that in this event, the regulator 233 is set so that the flow rate of the degassed thinner to be supplied to the filter 201 becomes about 60 mL/min.

Next, after the supply of the degassed thinner at 60 mL/min is performed for a predetermined time, the supply of the pressurizing gas to the pressure chamber 211 of the ump P1 is performed from the system of the regulator 234 and the flow rate of the degassed thinner to be supplied to the filter 201 is increased, for example, to about 75 mL/min. If the degassed thinner at a relatively large flow rate is supplied to the filter element 331 in the filter 201 from the beginning, the degassed thinner does not permeate the entire filter element 331, so that large and small bubbles may remain existing in the filter element 331. By supplying the degassed thinner first at a small flow rate as described above, the degassed thinner gradually permeates the filter element 331 and can efficiently discharge the bubbles to the outside of the filter 201.

Figure 12:
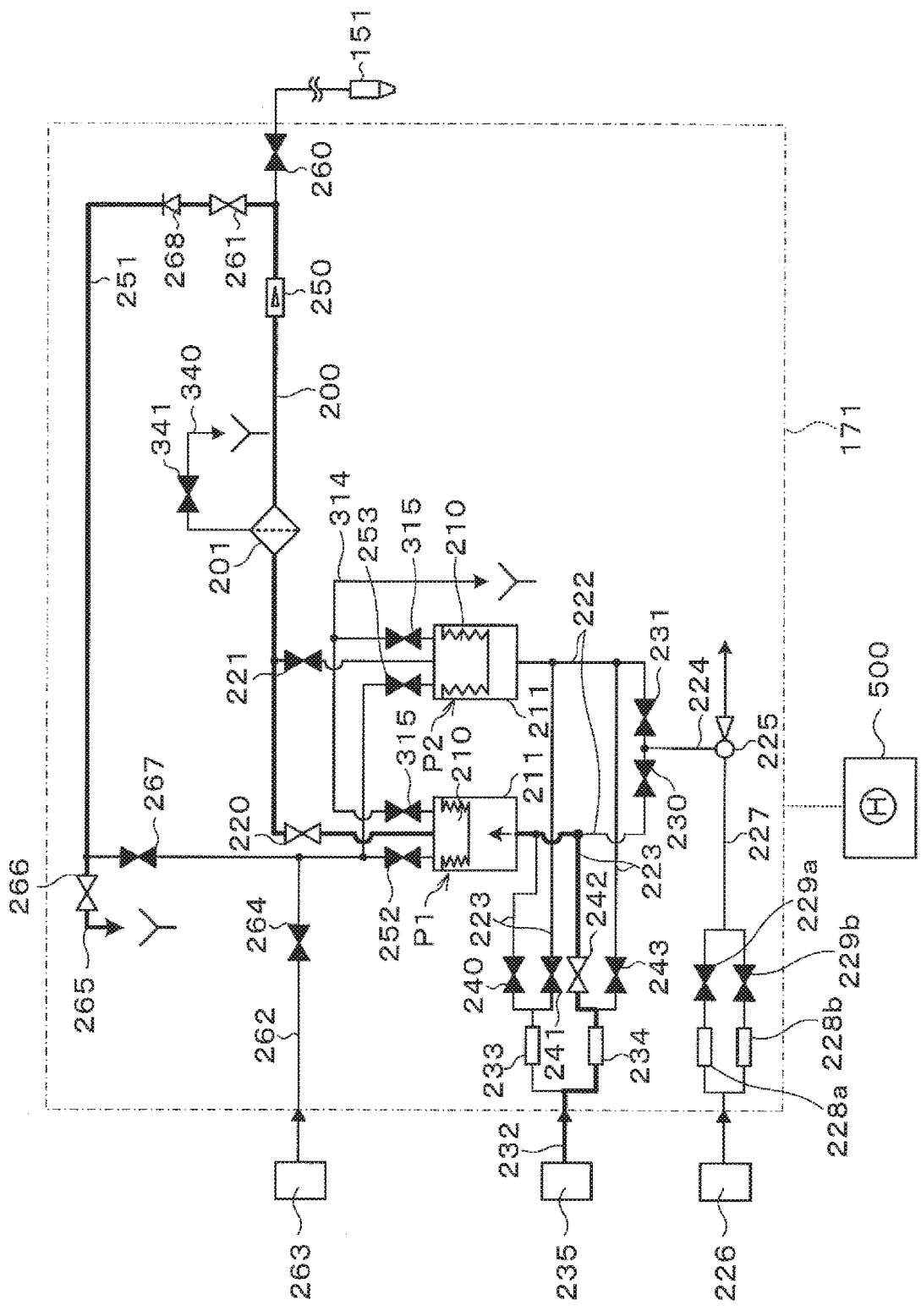
FIG. 12 is an explanatory view illustrating the pipe system for explaining the outline of the configuration of the thinner supply apparatus in a state in which the thinner is being discharged from a drain pipe.

Then, as illustrated in FIG. 12, the vent valve 341 is brought into a closed state, the circulation switching valve 261 and the drain valve 266 are brought into an open state, and the degassed thinner is pressure-fed from the pump P1 to thereby discharge the degassed thinner from the drain valve 266. Thus, the inside of the circulation pipe 251 is cleaned with the degassed thinner which has passed through the filter 201, and is brought into a clean state.

Figure 13:
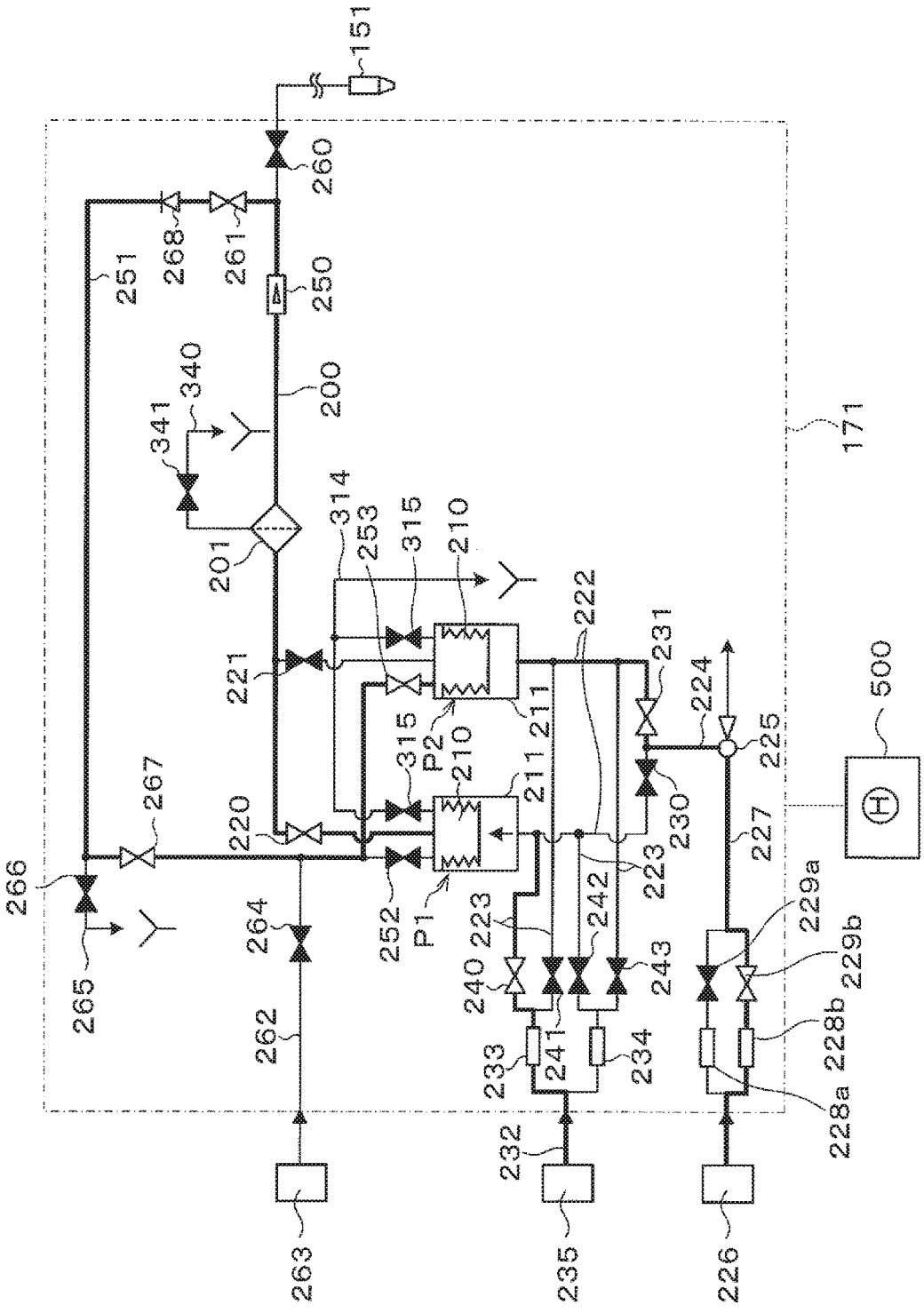
FIG. 13 is an explanatory view illustrating the pipe system for explaining the outline of the configuration of the thinner supply apparatus in a state in which a filter solution-passing step is being implemented.

Then, as illustrated in FIG. 13, the drain valve 266 is brought into a closed state, and the drain switching valve 267 and the switching valve 253 of the pump P2 are brought into an open state. In addition, the air ejector 225 is driven using the system of the regulator 228b to bring the pressure chamber 211 to a negative pressure. Note that the flow rate of the drive air flowing through the system of the regulator 228b is larger than the flow rate of the drive air flowing through the system of the regulator 228a. In other words, the pressure inside the pressure chamber 211 becomes lower than that in the case of using the system of the regulator 228a. The drive of the air ejector 225 pulls in the piston plate 304 of the pump P2 downward to bring the inside of the storage chamber 210 of the pump P2 to a negative pressure with respect to the storage chamber 210 of the pump P1. Thus, in the state in which the inside of the thinner supply pipe 200 and the circulation pipe 251 are brought to a negative pressure (pressure lower than the atmospheric pressure), the degassed thinner in the pump P1 is pulled into the pump P2 via the filter 201 (filter solution-passing step). Thus, for example, the inside of the filter 201 is also brought to a negative pressure, so that the bubbles in the filter 201 which have not been completely removed during the supply of the degassed thinner by the pump P1 expand in volume and become more likely to be discharged from the inside of the filter 201. Note that in the case where the piston plate 304 of the pump P1 cannot be lifted only by bringing the pressure chamber 211 of the pump P2 to a negative pressure by driving the air ejector 225, the pressurizing gas may be appropriately supplied into the pressure chamber 211 of the pump P1 to decrease the volume capacity of the storage chamber 210 to assist in lifting the piston plate 304. In this case, the supply of the pressurizing gas to the pressure chamber 211 of the pump P1 is performed, for example, by the system of the regulator 233 such that the pressure in the storage chamber 210 of the pump P1 does not become higher than the pressure in the storage chamber 210 of the pump P2, in other words, the inside of the thinner supply pipe 200 and the circulation pipe 251 is kept in a state at a pressure lower than the atmospheric pressure.

Thereafter, while the inside of the thinner supply pipe 200 and the circulation pipe 251 is maintained in the state of the negative pressure, the solution passage through the filer 201 by the pump P2 is stopped and that state is kept for a fixed period (negative pressure maintaining step). This further promotes the expansion of the bubbles in the filter 201 to facilitate the discharge of the bubbles from the filter 201. Further, the bubbles dissolve in the degassed thinner so that the removal of the bubbles from the inside of the filter 201 is also promoted. Note that the stop of the solution passes through the filter 201 while maintaining the negative pressure is realized, for example, by operating the switching valve 220 on the downstream side from the pump P1 from an open state into a closed state.

After maintaining the negative pressure for a fixed period, the switching valve 220 is brought into an open state again to pull the degassed thinner into the storage chamber 210 of the pump P2 from the storage chamber 210 of the pump P1. In short, the filter solution-passing step is performed again. Thus, the degassed thinner is newly supplied to the filter 201, so that, for example, even if the bubbles dissolve in the degassed thinner in the filter 201 up to a saturation state in the negative pressure maintaining step, removal of the bubbles can be performed again by the newly supplied degassed thinner. Then, the negative pressure maintaining step is performed again to further remove the bubbles. Then, by performing the filter solution-passing step and the negative pressure maintaining step a predetermined number of times, the bubbles in the filter 201 are almost completely removed.

Figure 14:
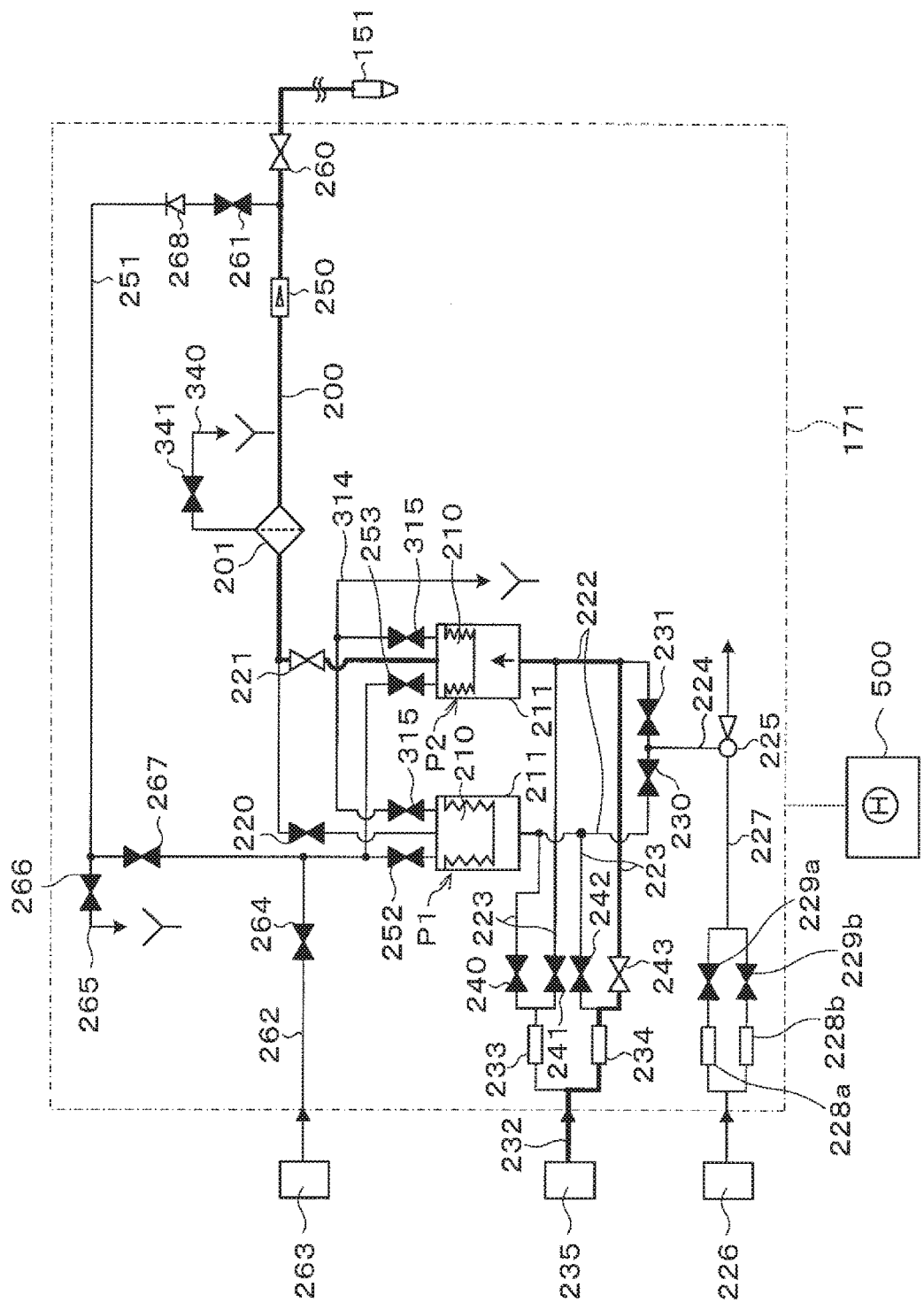
FIG. 14 is an explanatory view illustrating the pipe system for explaining the outline of the configuration of the thinner supply apparatus in a state in which the thinner is being supplied onto a wafer.

Thereafter, for example, when a predetermined amount of the degassed thinner is stored in the storage chamber 210 of the pump P2, the circulation switching valve 261 is switched to a closed state and the supply switching valve 260 is switched to an open state as illustrated, in FIG. 14. In addition, the drive of the air ejector 225 is stopped and the pressurizing gas is supplied into the pressure chamber 211 of the pump P2 using the system of the regulator 234. Thus, the degassed thinner in the pump P2 is supplied from the thinner supply nozzle 151 onto the wafer \V, whereby the wafer W is pre-wetted. Then, the resist solution is supplied from the resist solution supply nozzle 150 onto the wafer W, whereby a resist film is formed on the wafer W.

After the resist film is formed on the wafer W, the wafer W is then transferred to the upper anti-reflection film forming apparatus 33 in the first block G1, in which an upper anti-reflection film is formed on the wafer W. The wafer W is then transferred to the thermal treatment apparatus 40 in the second block G2 and subjected to heat treatment. The wafer W is then transferred to the edge exposure apparatus 42 and subjected to edge exposure processing.

The wafer W is then transferred by the wafer transfer apparatus 100 to the delivery apparatus 52 and transferred by the shuttle transfer apparatus 80 to the delivery apparatus 62 in the fourth block G4. The wafer W is thereafter transferred by the wafer transfer apparatus 110 in the interface station 13 to the exposure apparatus 12 and subjected to exposure processing in a predetermined pattern.

Then, the wafer W is transferred by the wafer transfer apparatus 70 to the thermal treatment apparatus 40 and subjected to post-exposure bake treatment. Thus, the resist is subjected to a deprotection reaction with an acid generated at an exposed portion of the resist film. The wafer W is thereafter transferred by the wafer transfer apparatus 70 to the developing treatment apparatus 30 and subjected to developing treatment.

After the developing treatment ends, the wafer W is transferred to the thermal treatment apparatus 40 and subjected to post-bake treatment. The wafer W is then temperature-regulated by the thermal treatment apparatus 40. The wafer W is thereafter transferred to the cassette C on a predetermined cassette mounting plate 21 via the wafer transfer mechanism 70 and the wafer transfer apparatus 23, with which a series of photolithography step ends.

According to the above embodiment, bringing the storage chamber 210 of the pump P2 on the downstream side from the filter 201 to a negative pressure with respect to the pressure in the storage chamber 210 of the pump P1 makes the degassed thinner in the pump P1 pass through the filter 201, thereby making it possible to promote the separation and the expansion in volume of the bubbles in the filter 201. Further, the degassed thinner is made to pass through the filter 201, so that the bubbles separated and expanded in volume dissolve in the degassed thinner and are removed from the filter 201. Further, the state in which the downstream side from the filter 201 is brought to a negative pressure is maintained for a predetermined time to thereby farther promote the removal of the bubbles. Accordingly by removing micro-bubbles from the filter 201, the decrease in performance of the filter 201 can be suppressed.

Further, repeatedly performing solution passage through the filter 201 by a negative pressure (filter solution-passing step) and maintaining of the negative pressure (negative pressure maintaining step) ensures that the bubbles in the filter 201 are further surely removed.

Furthermore, efficiently removing the bubbles from the filter 201 ensures that, for example, after the case where the filter element 331 is replaced by the maintenance of the filter 201 or the like, the thinner supply apparatus 171 quickly becomes usable and the amount of chemicals used for restoring the filter 201 is also reduced.

The present inventors have confirmed that by passing the degassed thinner through the filter 201 by the negative pressure and repeatedly performing the filter solution-passing step and the negative pressure maintaining step, the bubbles in the thinner can be reduced by almost 90% as compared with the case of solution-passing by pressurizing the filter.

Though the case of circulating the degassed thinner from the pump P1 toward the pump P2 has been described as an example in the above embodiment, the circulation direction of the degassed thinner is not limited to the contents of the embodiment, but the degassed thinner may be circulated from the pump P2 toward the pump P1. In this case, the operations of the switching valves and so on only need to be reversed, between the pump P1 and the pump P2, from those in the above embodiment.

The degassed thinner is supplied from the pump P2 to the thinner supply nozzle 151 after the filter solution-passing step and the negative pressure maintaining step are repeatedly performed in the above embodiment, but in the case of further repeating the filter solution-passing step and the negative pressure maintaining step, the flow of the degassed thinner from the pump P2 toward the pump P1 may be formed by evacuating the pressure chamber 211 of the pump P1 by the air ejector 225 and pressurizing the pressure chamber of the pump P2 using the system of the regulator 233 after a predetermined amount of the degassed thinner is stored in the storage chamber 210 of the pump P2, more specifically, after, for example, the sensor 321 detects that the degassed thinner in the storage chamber 210 of the pump P1 has run out. The degassed thinner can be freely circulated between the pump P1 and the pump P2 using the circulation pipe 251 as described above, the filter solution-passing step and the negative pressure maintaining step can be repeated a desired number of times as needed.

Note that the above embodiment has been described using the case using two pumps P1, P2 as an example, but the two pumps do not always need to be provided but only one pump may be provided as long as it is, for example, a pump having two or more independent mechanisms which are freely switched over between a positive pressure and a negative pressure.

Incidentally, when the inventors further carried out an experiment, it sometimes took, only by the above-described negative pressure maintaining step, a considerable firm, for example, about 90 seconds to reach an expected pressure reduction degree, for example, about −45 kPa depending on the length of the pipe or the like. As is well known, for the manufacture of the semiconductor device, the reduction in throughput is a great concern. Hence, to efficiently reduce the pressure to achieve a predetermined negative pressure in a shorter time, the following process is proposed.

Figure 15:
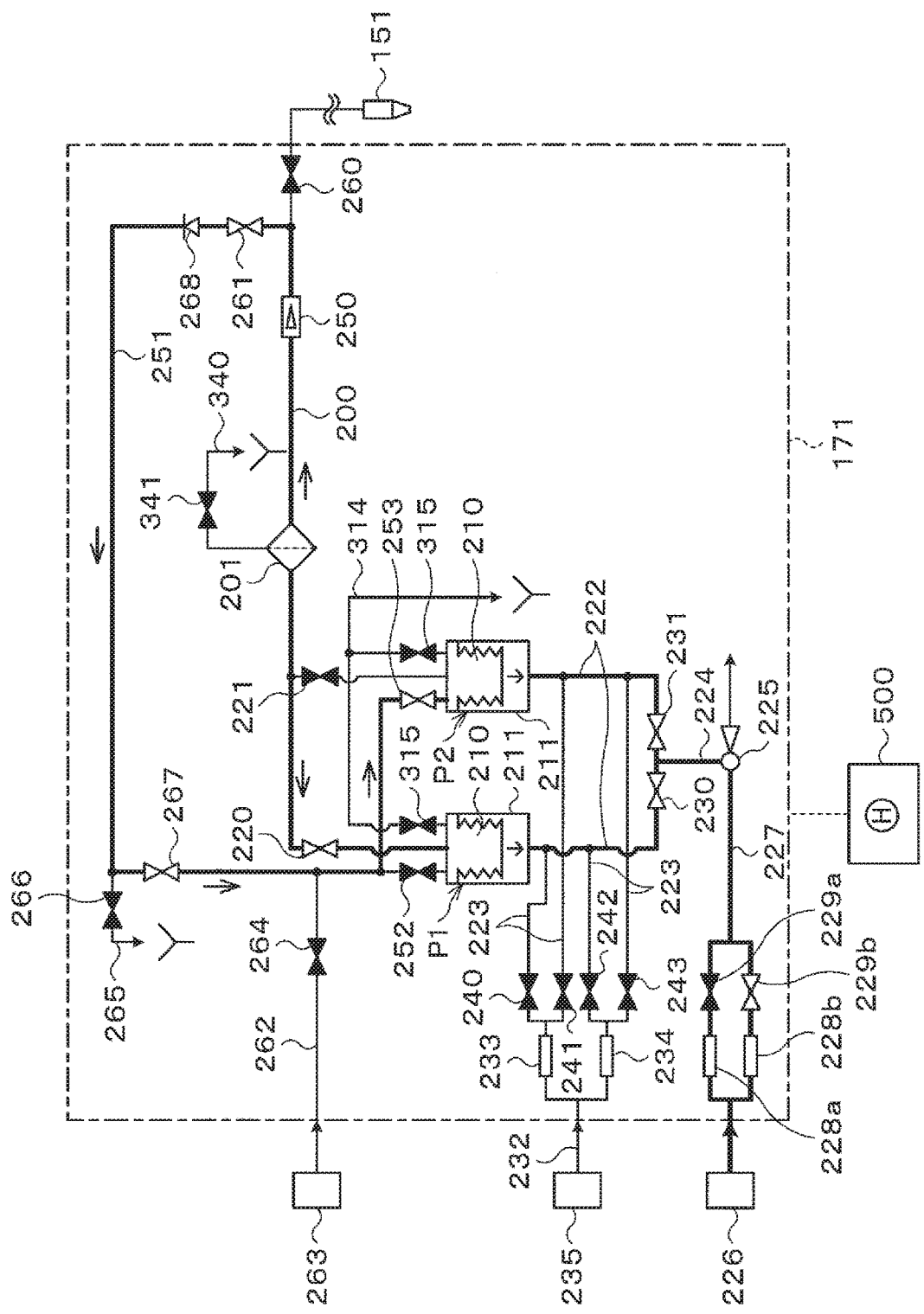
FIG. 15 is an explanatory view illustrating the pipe system illustrating the outline of the configuration of the thinner supply apparatus in a state in which a both-direction degassing step is implemented.

FIG. 15 illustrates various valves and the solution flow of the thinner in that case. More specifically, the drain valve 266 is brought into a closed state and the drain switching valve 267 and the switching valve 253 of the pump P2 are brought into an open state. Thus, in the system of the pump P2, a pipeline linking the thinner supply pipe 200, the circulation pipe 251, and the storage chamber 210 is formed. On the other hand, regarding the pump P1 system, the switching valve 220 is brought into an open state and the switching valve 252 and the discharge valve 315 are brought into a closed state, whereby a pipeline linking the thinner supply pipe 200 and the storage chamber 210 of the pump P1 is formed.

Further, for the gas supply source 235 system, all of the switching valves 240, 241, 242, 243 are brought into a closed state. On the other hand, regarding the air ejector 225 system, the switching valves 230, 231 are brought into an open state, the switching valve 229a is brought into a closed state, and the switching valve 229b is brought into an open state.

In this state, the air ejector 225 is driven. Thus, both of the piston plates 304 of the pumps P1, P2 are pulled in downward, and both of the pressure chambers 211 of the pumps P1, P2 are brought into negative pressures equal to each other, so that the storage chambers 210 of the pumps P1, P2 are brought into the same negative pressure. Accordingly, the inside of the thinner supply pipe 200 and the circulation pipe 251 is also brought to a negative pressure, but when the filter 201 is regarded as a pressure resistance, the thinner in the thinner supply pipe 200 tries to flow toward the storage chamber 210 of the pump P1 on the upstream side with the filter 201 as a boundary and to flow toward the storage chamber 210 of the pump P2 on the downstream side. However, as described above, since both of the storage chambers 210 of the pumps P1 P2 are at the same negative pressure as described above, the thinner in the thinner supply pipe 200 and the circulation pipe 251 does not flow.

By reducing the pressure from both of the upstream side and the downstream side from the filter 201 to a negative pressure, the thinner in the thinner supply pipe 200 and the circulation pipe 251 is subjected to, so to speak, degassing from both directions (both-direction degassing step), Accordingly, the degassing itself is also promoted. In this case, since the negative pressure is made from both directions, the time required to generate a predetermined negative pressure becomes shorter than that in the negative pressure maintaining step, namely, in the case where while the inside of the thinner supply pipe 200 and the circulation pipe 251 is maintained in the state of the negative pressure, the solution passage through the filer 201 by the pump P2 is stopped and that state is kept for a fixed period.

Figure 16:
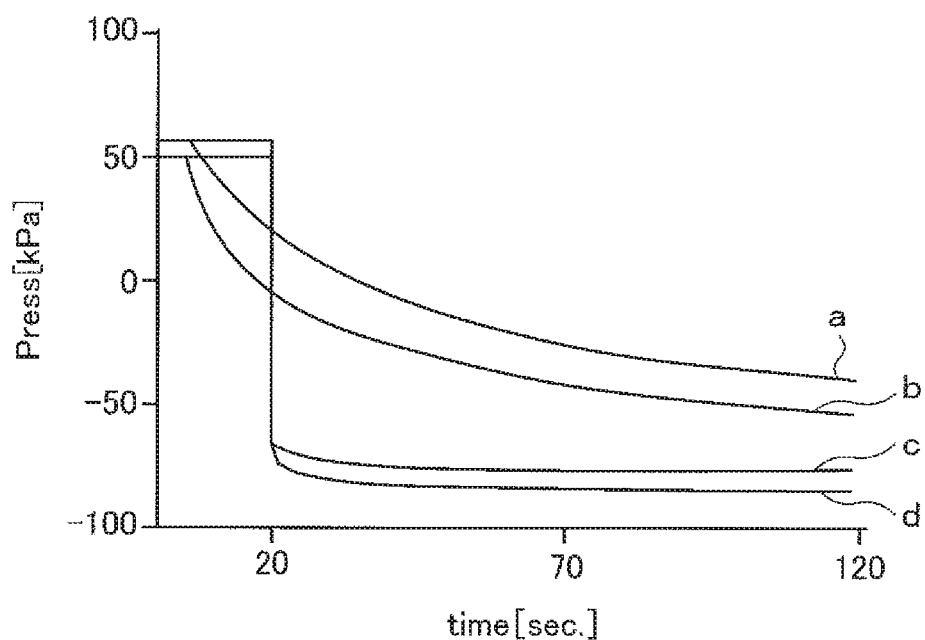
FIG. 16 is a graph illustrating variations with time in pressure in a pipe on the upstream side and the downstream side from the filter when only the negative pressure maintaining step was carried out and when the both-direction degassing step was carried out after the negative pressure maintaining step.

FIG. 16 illustrates a result of an experiment carried out regarding the point, and the graph in FIG. 16 illustrates variations with time in pressure in the pipe on the upstream side and on the downstream side from the filter 201 respectively when the above-described negative pressure maintaining step was carried out and when the both-direction degassing step was carried out, and in the graph, a represents the variation in pressure on the upstream side from the filter 201 when the negative pressure maintaining step was carried out at 80 kPa, b represents the variation in pressure on the downstream side from the filter 201 when the negative pressure maintaining step was carried out at 80 kPa, c represents the variation in pressure on the upstream side from the filter 201 when the both-direction degassing step was carried out after the negative pressure maintaining step was carried out at 80 kPa for 20 seconds, and d represents the variation in pressure on the downstream side from the filter 201 when the both-direction degassing step was carried out after the negative pressure maintaining step was carried out at 80 kPa for 20 seconds.

As is understood from the results, in the case where the negative pressure maintaining step was carried out, it took about 45 seconds to reach −45 kPa, whereas in the case where the both-direction degassing step was carried out, −80 kPa could be realized in 0.5 seconds from the start. Accordingly, it was found that a higher pressure reduction degree can be realized in a much shorter time than in the case of only the negative pressure maintaining step. This makes it possible to reveal more bubbles in the thinner in the thinner supply pipe 200 and the circulation pipe 251 in a shorter time.

As an actual process, it is necessary to remove the bubbles in the filter 201 by the already-described filter solution-passing step, and therefore it is preferable to perform the above-described both-direction degassing step and filter solution-passing step in combination. In this case, as the procedure of processes, either of them may be performed first, but it is preferable to pass the thinner through the filter 201 first, namely, to perform the filter solution-passing step and then perform the both-direction degassing step.

The negative pressure maintaining step may be additionally performed as a matter of course, but the both-direction degassing step may be performed in place of the negative pressure maintaining step. Further, the filter solution-passing step and the both-direction degassing step may be repeatedly performed. This enables removal of many more bubbles.

Note that in the case of implementing the both-direction degassing step, it is most preferable to bring the storage chambers 210 of the pumps P1, P2 to the same negative pressure because the thinner does not flow, but if the thinner flows into the storage chamber 210 of the pump P1, the following discharge is troublesome. Therefore, when it is difficult or it takes time to bring them to the same pressure, the negative pressure on the side of the storage chamber 210 of the pump P2 may be brought into a state of being slightly higher (larger in pressure reduction degree) in consideration of the risk of the thinner flowing into the storage chamber 210 of the pump P1.

Taking the circumstances into consideration, it is practical to implement the above-described filter solution-passing step first to bring only the storage chamber 210 of the pump P2 side to a negative pressure once, and then gradually bringing the switching valve 230 of the pump P1 system into an open state in order to equally bring the storage chambers 210 of the pumps P1, P2 to the negative pressure, and this is preferable also in the viewpoint of passing the thinner through the above-described filter 201 in advance.

Figure 17:
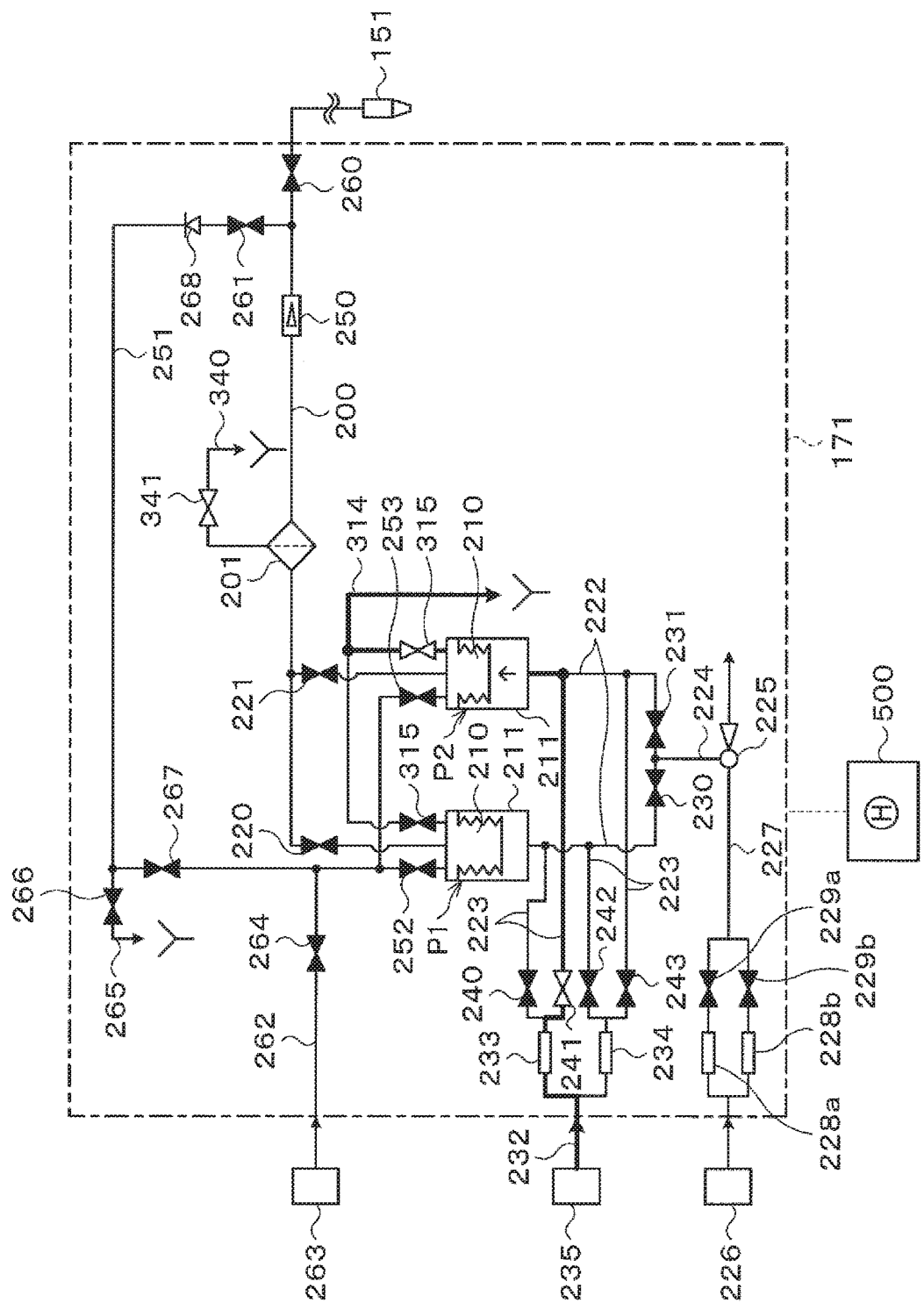
FIG. 17 is an explanatory view illustrating the pipe system illustrating the outline of the configuration of the thinner supply apparatus in a state in which bubbles and the thinner are being discharged from the pump to the outside of the system.

Note that after the filter solution-passing step and the both-direction degassing step are implemented as described above to achieve the expected removal of bubbles, the discharge valve 315 only needs to be brought into an open state as illustrated in FIG. 17 to discharge the thinner, in which the bubbles are mixed, stored in the storage chamber 210 of the pump P2 to the outside of the system.

Though the case where the treatment solution is a thinner has been described as an example in the above embodiment, what solution is to be used as the treatment solution is not limited to the contents of the embodiment, and, for example, the resist solution and the developing solution may be used as the treatment solution.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to the examples but may take various aspects. The present invention is also applicable to the case where the substrate is another substrate such as an FPD (Flat Panel Display), a mask reticle for a photomask or the like other than the wafer.

What is claimed is:

1. A treatment solution supply method of supplying a treatment solution onto a substrate, the method comprising:
   a degassed treatment solution generating step of removing bubbles dissolved in the treatment solution by a degassing mechanism to generate a degassed treatment solution;
   a treatment solution storing step of storing the degassed treatment solution in a container;
   a filter solution-passing step of bringing a downstream side from a filter connected to a downstream side from the container via a treatment solution supply pipe to a negative pressure with respect to a pressure in the container to pass the degassed treatment solution in the container through the filter; and
   a negative pressure maintaining step of maintaining a state in which the downstream side from the filter is brought to the negative pressure, for a predetermined period, after stopping supply of the treatment solution from the container to the filter.

2. The treatment solution supply method according to claim 1,
   wherein the filter solution-passing step and the negative pressure maintaining step are repeatedly performed.

3. A treatment solution supply method of supplying a treatment solution onto a substrate, the method comprising:
   a degassed treatment solution generating step of removing bubbles dissolved in the treatment solution by a degassing mechanism to generate a degassed treatment solution;
   a treatment solution storing step of storing the degassed treatment solution in a container;
   a filter solution-passing step of bringing a downstream side from a filter connected to a downstream side from the container via a treatment solution supply pipe to a negative pressure with respect to a pressure in the container to pass the degassed treatment solution in the container through the filter; and
   a both-direction degassing step of reducing a pressure from an upstream side and the downstream side from the filter to degas the treatment solution, after stopping the supply of the treatment solution from the container to the filter.

4. The treatment solution supply method according to claim 3,
   wherein the filter solution-passing step and the both-direction degassing step are repeatedly performed.

5. The treatment solution supply method according to claim 1, further comprising:
   a treatment solution discharging step of discharging a treatment solution stored in the container to an outside of the container before the degassed treatment solution generating step.

6. The treatment solution supply method according to claim 3, further comprising:
   a treatment solution discharging step of discharging a treatment solution stored in the container to an outside of the container before the degassed treatment solution generating step.

7. The treatment solution supply method according to claim 1,
   wherein in the filter solution-passing step, a volume capacity of a storage chamber variable in volume capacity connected to the downstream side from the filter of the treatment solution supply pipe is increased to bring the downstream side from the filter to the negative pressure.

8. The treatment solution supply method according to claim 3,
   wherein in the filter solution-passing step, a volume capacity of a storage chamber variable in volume capacity connected to the downstream side from the filter of the treatment solution supply pipe is increased to bring the downstream side from the filter to the negative pressure.

9. The treatment solution supply method according to claim 7,
   wherein the container has another storage chamber variable in volume capacity, and
   wherein in the filter solution-passing step, a volume capacity of the another storage chamber is decreased with movement of the degassed treatment solution from the container to the filter.

10. The treatment solution supply method according to claim 8,
    wherein the container has another storage chamber variable in volume capacity, and
    wherein in the filter solution-passing step, a volume capacity of the another storage chamber is decreased with movement of the degassed treatment solution from the container to the filter.

11. A non-transitory computer-readable storage medium storing a program running on a computer of a control unit for controlling a treatment solution supply apparatus to cause the treatment solution supply apparatus to perform a treatment solution supply method of supplying a treatment solution onto a substrate,
    the treatment solution supply method comprising:
    a degassed treatment solution generating step of removing bubbles dissolved in the treatment solution by a degassing mechanism to generate a degassed treatment solution;
    a treatment solution storing step of storing the degassed treatment solution in a container;
    a filter solution-passing step of bringing a downstream side from a filter connected to a downstream side from the container via a treatment solution supply pipe to a negative pressure with respect to a pressure in the container to pass the degassed treatment solution in the container through the filter; and
    a negative pressure maintaining step of maintaining a state in which the downstream side from the filter is brought to the negative pressure, for a predetermined period, after stopping supply of the treatment solution from the container to the filter.

12. A non-transitory computer-readable storage medium storing a program running on a computer of a control unit for controlling a treatment solution supply apparatus to cause the treatment solution supply apparatus to perform a treatment solution supply method of supplying a treatment solution onto a substrate,
    the treatment solution supply method comprising:
    a degassed treatment solution generating step of removing bubbles dissolved in the treatment solution by a degassing mechanism to generate a degassed treatment solution;
    a treatment solution storing step of storing the degassed treatment solution in a container;
    a filter solution-passing step of bringing a downstream side from a filter connected to a downstream side from the container via a treatment solution supply pipe to a negative pressure with respect to a pressure in the container to pass the degassed treatment solution in the container through the filter; and a both-direction degassing step of reducing a pressure from an upstream side and the downstream side from the filter to degas the treatment solution, after stopping supply of the treatment solution from the container to the filter.

* * * * *